United States Patent
Yen et al.

(10) Patent No.: US 11,545,406 B2
(45) Date of Patent: Jan. 3, 2023

(54) SUBSTRATE STRUCTURE, SEMICONDUCTOR PACKAGE STRUCTURE AND METHOD FOR MANUFACTURING A SUBSTRATE STRUCTURE

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW); Kay Stefan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 139 days.

(21) Appl. No.: 17/066,407

(22) Filed: Oct. 8, 2020

(65) Prior Publication Data
US 2022/0115288 A1    Apr. 14, 2022

(51) Int. Cl.
| | | |
|---|---|---|
| H01L 23/48 | (2006.01) |
| H01L 23/52 | (2006.01) |
| H01L 29/40 | (2006.01) |
| H01L 23/31 | (2006.01) |
| H01L 21/56 | (2006.01) |
| H01L 23/00 | (2006.01) |

(52) U.S. Cl.
CPC .......... *H01L 23/3192* (2013.01); *H01L 21/56* (2013.01); *H01L 24/05* (2013.01); *H01L 2224/03013* (2013.01)

(58) Field of Classification Search
CPC combination set(s) only.
See application file for complete search history.

(56) References Cited

U.S. PATENT DOCUMENTS

| | | | |
|---|---|---|---|
| 10,892,250 B2* | 1/2021 | Chen | H01L 24/20 |
| 2013/0001776 A1* | 1/2013 | Yu | H01L 23/481 |
| | | | 257/E23.021 |
| 2019/0172769 A1* | 6/2019 | Hardiman | H01L 21/56 |
| 2020/0395272 A1* | 12/2020 | Bang | H01L 23/49548 |

\* cited by examiner

*Primary Examiner* — Niki H Nguyen
(74) *Attorney, Agent, or Firm* — Foley & Lardner LLP

(57) ABSTRACT

A substrate structure, a semiconductor package structure including the same and a method for manufacturing the same are provided. The substrate structure includes a first passivation layer, a first circuit layer and a first protection layer. The first passivation layer has a first surface and a second surface opposite to the first surface. The first circuit layer has an outer lateral surface. A first portion of the first circuit layer is disposed in the first passivation layer. The first protection layer is disposed on a second portion of the first circuit layer and exposed from the first surface of the first passivation layer. The outer lateral surface of the first circuit layer is covered by the first passivation layer or the first protection layer.

8 Claims, 25 Drawing Sheets

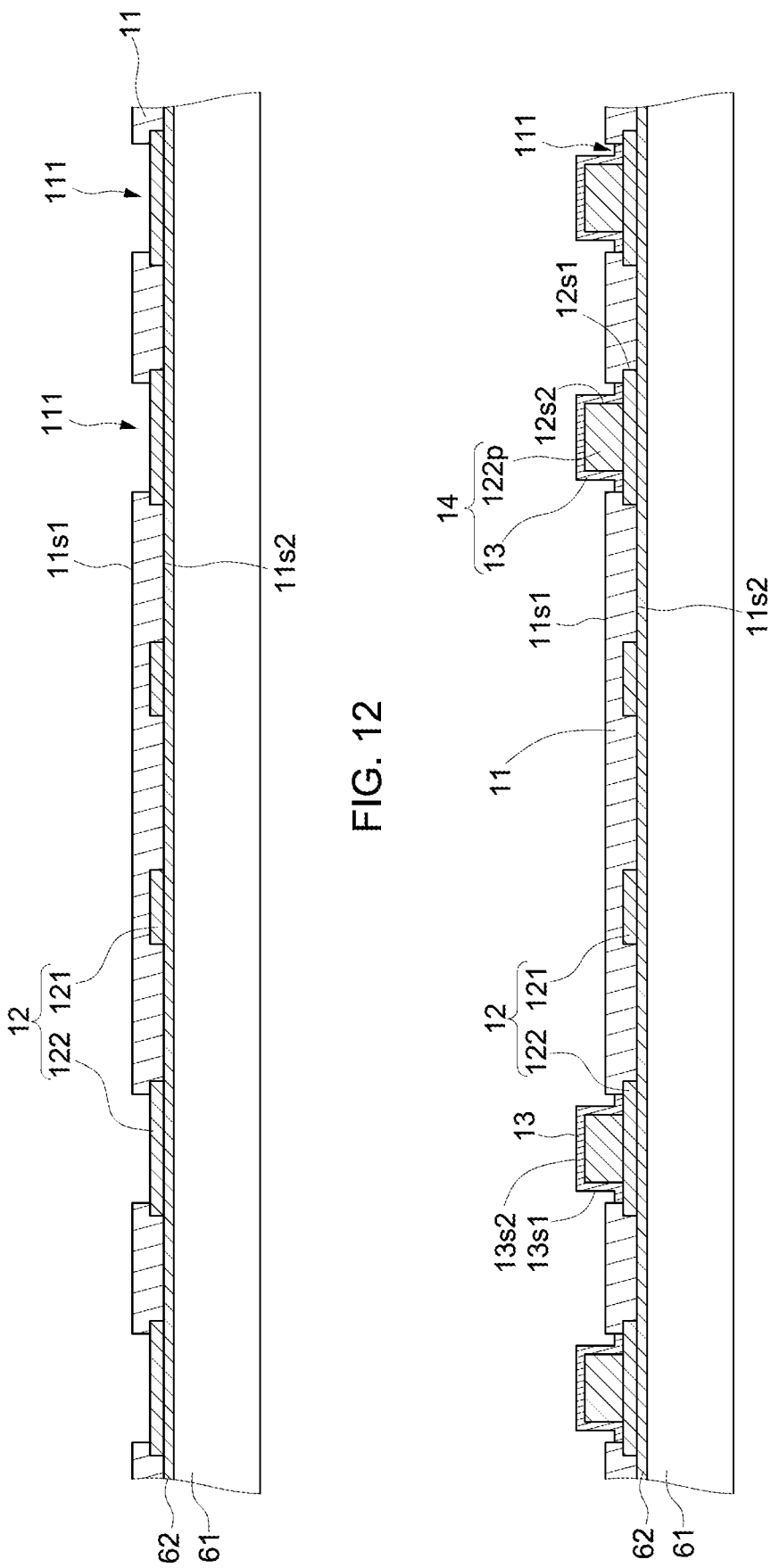

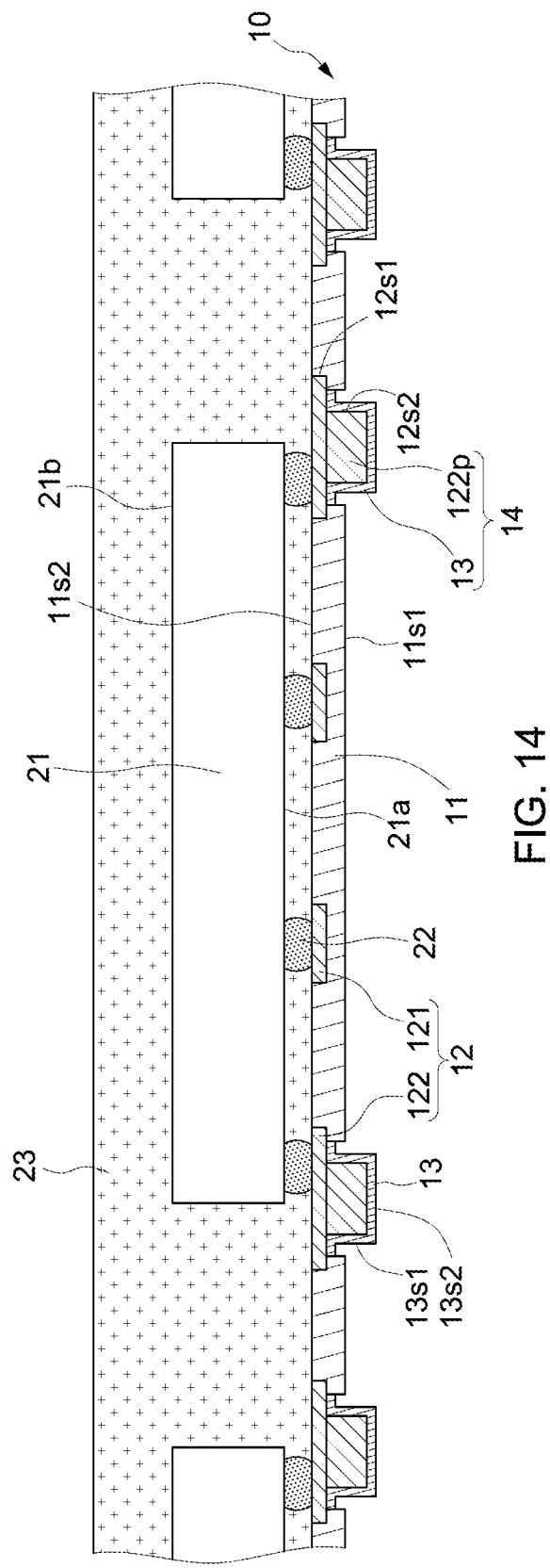

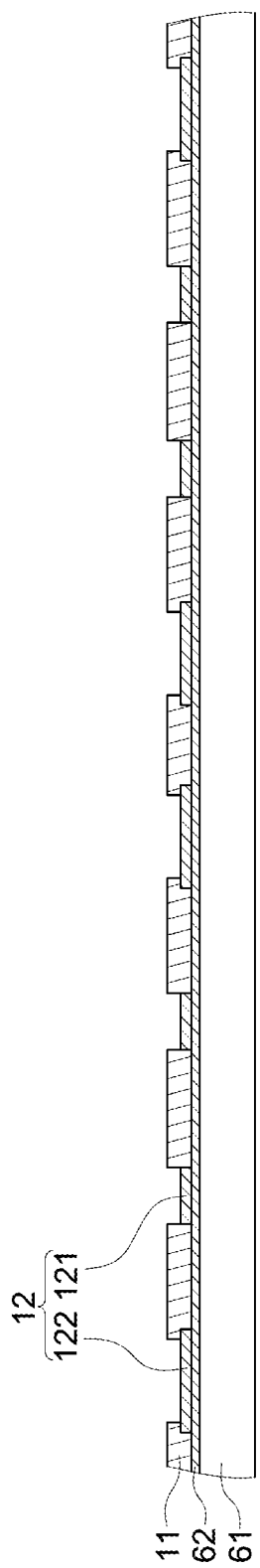
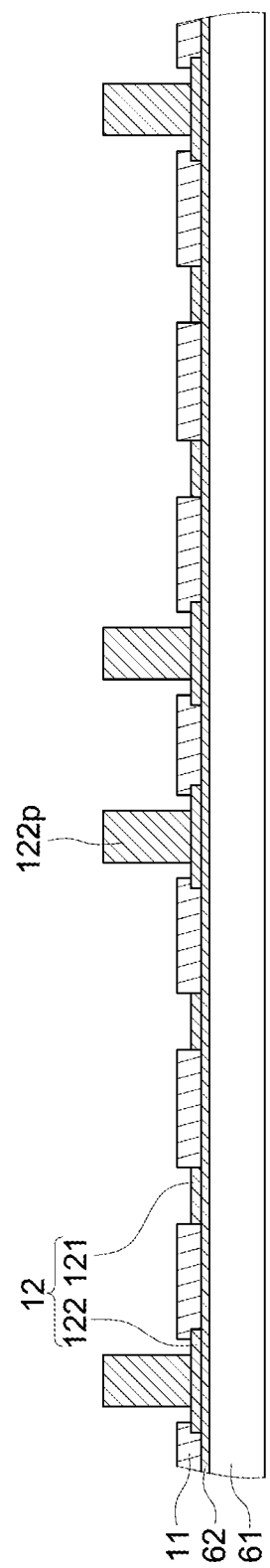

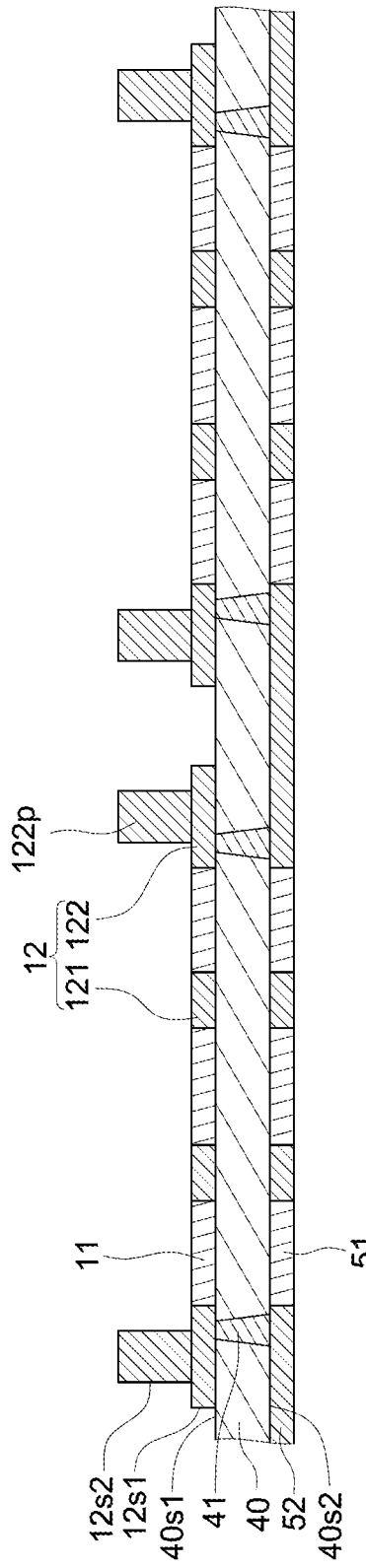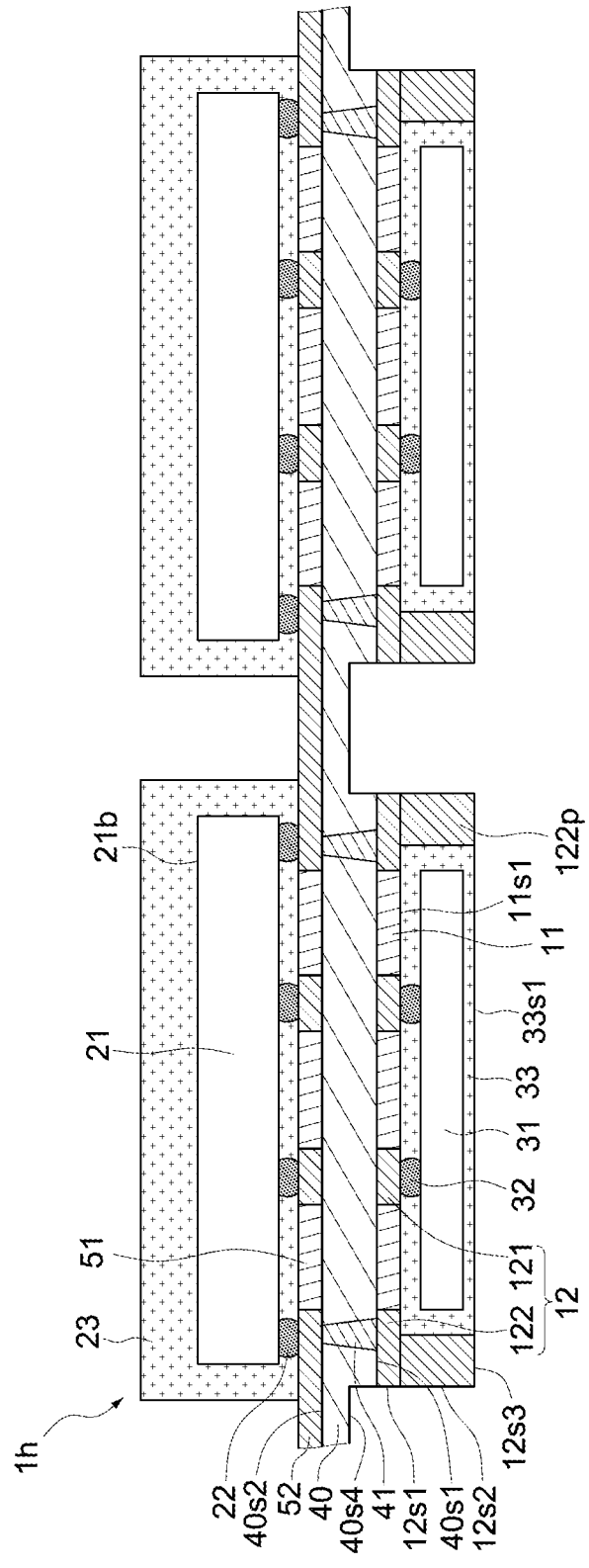

SUBSTRATE STRUCTURE, SEMICONDUCTOR PACKAGE STRUCTURE AND METHOD FOR MANUFACTURING A SUBSTRATE STRUCTURE

BACKGROUND

1. Field of the Disclosure

The present disclosure relates to a substrate structure and a manufacturing method forming the same, and to a semiconductor package structure including the same.

2. Description of the Related Art

As automotive electronic components develop, the integration of wettable flank and other components becomes more important. Conventionally, a wettable flank is formed by performing pre-cut or half-etching process on a substrate structure, which leads a metal layer to be exposed from an encapsulant. The exposed metal layer is prone to oxidation, degrading the reliability of automotive electronic components. Therefore, a new substrate structure is required to solve above problems.

SUMMARY

In some embodiments, a substrate structure includes a first passivation layer, a first circuit layer and a first protection layer. The first passivation layer has a first surface and a second surface opposite to the first surface. The first circuit layer has an outer lateral surface. A first portion of the first circuit layer is disposed in the first passivation layer. The first protection layer is disposed on a second portion of the first circuit layer and exposed from the first surface of the first passivation layer. The outer lateral surface of the first circuit layer is covered by the first passivation layer or the first protection layer.

In some embodiments, a semiconductor package structure includes a substrate structure, a first semiconductor die and a first encapsulant. The substrate structure includes a first passivation layer, a first circuit layer and a first protection layer. The first passivation layer has a first surface and a second surface opposite to the first surface. The first circuit layer is disposed adjacent to the second surface of the first passivation layer and has an outer lateral surface. The first protection layer is disposed on the first circuit layer and exposed from the first surface of the first passivation layer. The first semiconductor die is disposed on the second surface of the first passivation layer. The first encapsulant covers the first semiconductor die and the second surface of the first passivation layer. There is a predetermined distance between the outer lateral surface of the first circuit layer and a lateral surface of the first encapsulant.

In some embodiments, a method for manufacturing a substrate structure includes: (a) forming a first circuit layer, wherein the first circuit layer comprises a first portion and a second portion; (b) forming a first passivation layer covering the first portion of the first circuit layer, wherein the second portion of the first circuit layer is exposed from the first passivation layer; (c) forming a first protection layer on the second portion of the first circuit layer; and (d) sawing the first passivation layer such that an outer lateral surface of the first circuit layer is covered by the first passivation layer or the first protection layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 12 illustrates one or more stages of an example of a method for manufacturing a semiconductor package structure according to some embodiments of the present disclosure.

FIG. 13 illustrates one or more stages of an example of a method for manufacturing a semiconductor package structure according to some embodiments of the present disclosure.

FIG. 14 illustrates one or more stages of an example of a method for manufacturing a semiconductor package structure according to some embodiments of the present disclosure.

FIG. 20 illustrates one or more stages of an example of a method for manufacturing a semiconductor package structure according to some embodiments of the present disclosure.

FIG. 21 illustrates one or more stages of an example of a method for manufacturing a semiconductor package structure according to some embodiments of the present disclosure.

FIG. 27 illustrates one or more stages of an example of a method for manufacturing a semiconductor package structure according to some embodiments of the present disclosure.

FIG. 28 illustrates one or more stages of an example of a method for manufacturing a semiconductor package structure according to some embodiments of the present disclosure.

DETAILED DESCRIPTION

Figure 1:
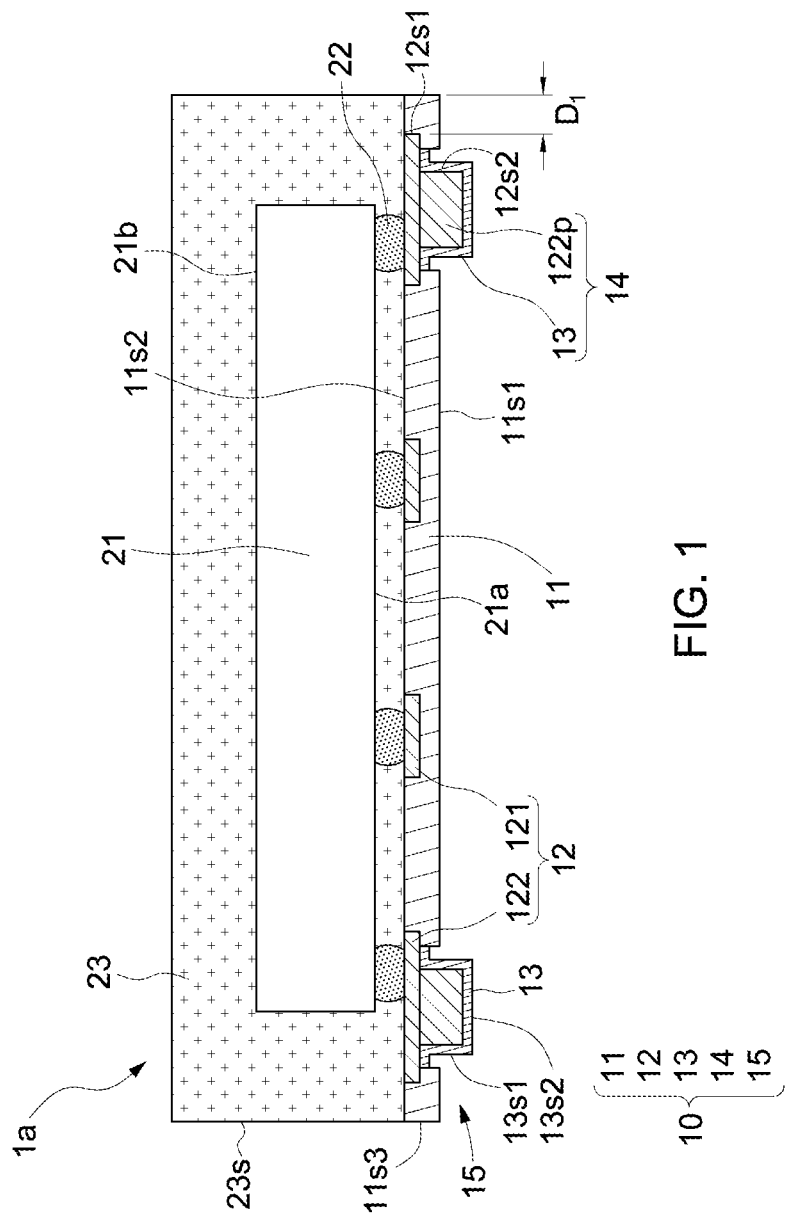
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor package structure 1a according to some embodiments of the present disclosure. The semiconductor package structure 1a may include a substrate structure 10, a first semiconductor die 21, a conductive terminal 22 and a first encapsulant 23.

In some embodiments, the substrate structure 10 may include a first passivation layer 11, a first circuit layer 12, a first protection layer 13, a solder wettable flank 14 and a depression structure 15. The first passivation layer 11 may have a first surface 11s1, a second surface 11s2 and an outer lateral surface 11s3. The second surface 11s2 may be opposite to the first surface 11s1. The outer lateral surface 11s3 may extend between the first surface 11s1 and the second surface 11s2. The first passivation layer 11 may include a solder resist material, such as, for example, epoxy acrylate, benzocyclobutene (BCB) or polyimide.

The first circuit layer 12 may be disposed on or adjacent to the second surface 11s2 of the first passivation layer 11. The first circuit layer 12 may include, for example, copper, another conductive metal, or an alloy thereof. The first circuit layer 12 may include a first portion 121 and a second portion 122. The first portion 121 may be disposed or embedded in the first passivation layer 11. For example, the first portion 121 may be exposed from the second surface 11s2 of the first passivation layer 11. A portion of the second portion 122 may be exposed from the first passivation layer 11. In some embodiments, the second portion 122 may include a protruding portion 122p. The protruding portion 122p may be spaced apart from the first passivation layer 11. For example, the protruding portion 122p may protrude from the first surface 11s1 of the first passivation layer 11, and the first passivation layer 11 may not be in contact with the protruding portion 122p. The protruding portion 122p may be exposed from the first passivation layer 11. The first circuit layer 12 may have an outer lateral surface 12s1 and an outer lateral surface 12s2. The outer lateral surface 12s1 and the outer lateral surface 12s2 are not coplanar with each other. The outer lateral surface 12s2 may be the outer lateral surface of the protruding portion 122p. The outer lateral surface 12s1 may be closer to the outer lateral surface 11s3 of the first passivation layer 11s than the outer lateral surface 12s2 is. In some embodiments, the outer lateral surface 12s1 of the first circuit layer 12 may be covered by the first passivation layer 11. In some embodiments, there is a predetermined distance $D_1$ between the outer lateral surface 12s1 of the first circuit layer 12 and the outer lateral surface 11s3 of the first passivation layer 11. Thus, the outer lateral surface 12s1 of the first circuit layer 12 may not exposed from the outer lateral surface 11s3 of the first passivation layer 11. In some embodiments, the predetermined distance $D_1$ ranges from about 30 μm to about 70 In some embodiments, the predetermined distance $D_1$ ranges from about 50 μm to about 70 μm.

The first protection layer 13 may be disposed on the second portion 122 of the first circuit layer 12, and exposed from the first surface 11s1 of the first passivation layer 11. The first protection layer 13 may cover the protruding portion 122p of the second portion 122 of the first circuit layer 12. The first protection layer 13 is configured to prevent from oxidation of the first circuit layer 12. In some embodiments, the first protection layer 13 may include an anti-oxidation layer. In some embodiments, the first protection layer 13 may include a metal finish layer, such as NiAu alloy or other suitable materials. The first protection layer 13 may be in contact with the first passivation layer 11. In some embodiments, the first protection layer 13 may be surrounded by the outer lateral surface 11s3 of the first passivation layer 11. In some embodiments, the outer lateral surface 12s2 of the first circuit layer 12 is covered by the first protection layer 13. The first protection layer 13 may have a lateral surface 13s1 and a surface 13s2 (or may be referred to as a lower surface 13s2) adjacent to the lateral surface 13s1. In some embodiments, the surface 13s2 of the first protection layer 13 may be lower than the first surface 11s1 of the first passivation layer 11. For example, a distance between the second surface 11s2 of the first passivation layer 11 and the surface 13s2 of the first protection layer 13 is greater than a distance between the second surface 11s2 of the first passivation layer 11 and the first surface 11s1 of the first passivation layer 11.

The solder wettable flank 14 may be composed of the protruding portion 122p of the first circuit layer 12 and the first protection layer 13. The solder wettable flank 14 can be used for inspection to insure the joint quality between the semiconductor package structure (such as the semiconductor package structure 1a) and the motherboard (not shown).

The depression structure 15 may be located adjacent to the solder wettable flank 14. The depression structure 15 may be defined by the first surface 11s1 of the first passivation layer 11 and the lateral surface 13s1 of the first protection layer 13.

The first semiconductor die 21 may be disposed on the second surface 11s2 of the first passivation layer 11. As shown in FIG. 1, the first semiconductor die 21 may have a first surface 21a (e.g., an active surface) and a second surface 21b (e.g., a backside surface) opposite to the first surface 21a. The first surface 21a may face the first passivation layer 11. The first surface 21a of the first semiconductor die 21 may be attached to or electrically connected to the first circuit layer 12 of the substrate structure 10 through the conductive terminals 22 (e.g., solder materials).

The first encapsulant 23 may be disposed on the second surface 11s2 of the first passivation layer 11. The first encapsulant 23 may cover the first semiconductor die 21 and the conductive terminals 22. The first encapsulant 23 may be a molding compound with or without fillers, or a dielectric layer, and may include, or be formed from, a photoresist layer, a cured photosensitive material or a cured photoimageable dielectric (PID) material. For example, the first encapsulant 23 may include a polyamide (PA), an Ajinomoto build-up film (ABF), a bismaleimide-triazine (BT), a polyimide (PI), epoxy or polybenzoxazole (PBO), or a combination of two or more thereof. In some embodiments, a lateral surface 23s of the first encapsulant 23 is substantially coplanar with the outer lateral surface 11s3 of the first passivation layer 11.

Figure 2:
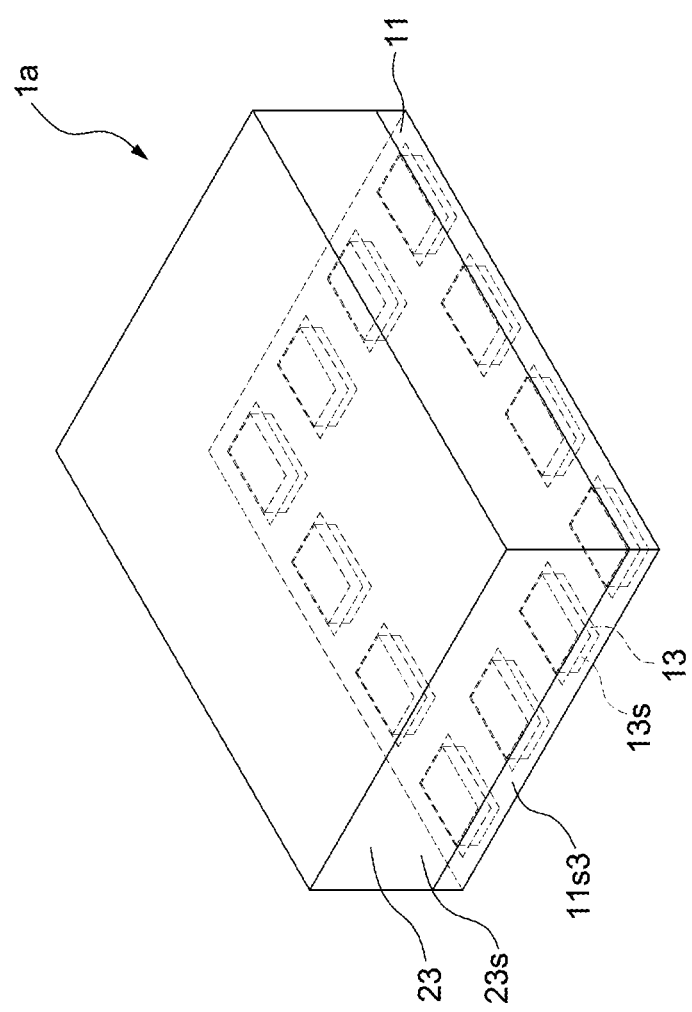
FIG. 2 illustrates a top perspective view of the semiconductor package structure of FIG. 1.
Figure 3:
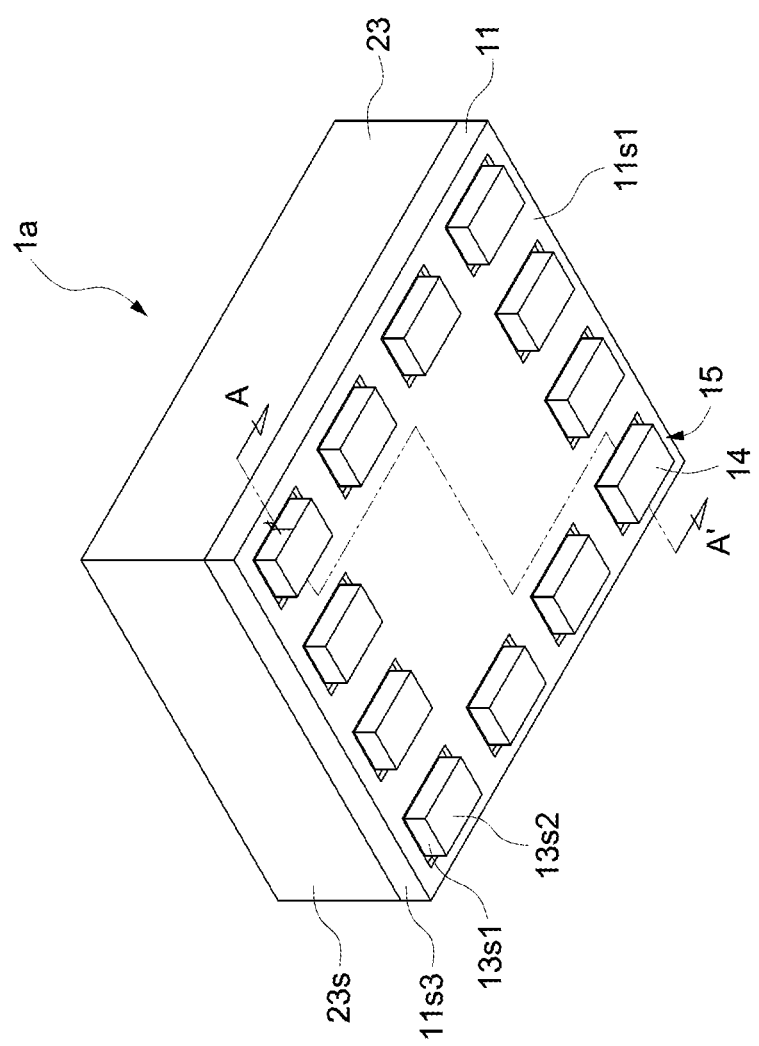
FIG. 3 illustrates a bottom perspective view of the semiconductor package structure of FIG. 1.

FIG. 2 illustrates a top perspective view of the semiconductor package structure 1a of FIG. 1. FIG. 3 illustrates a bottom perspective view of the semiconductor package structure 1a of FIG. 1. FIG. 1 is a cross-sectional view taken along line A-A' of FIG. 3. As shown in FIG. 2, the lateral surface 23s of the first encapsulant 23 may be substantially coplanar with the outer lateral surface 11s3 of the first passivation layer 11. As shown in FIG. 3, the lateral surface 13s1 of the first protection layer 13 may be longitudinally exposed from the outer lateral surface 11s3 of the first passivation layer 11. That is, a portion of the lateral surface 13s1 of the first protection layer 13 is not covered by the outer lateral surface 11s3 of the first passivation layer 11. The lateral surface 13s1 of the first protection layer 13 is not coplanar with the outer lateral surface 11s3 of the first passivation layer 11. As shown in FIG. 3, the solder wettable flanks 14 may be disposed on the peripheral of the first surface 11s1 of the first passivation layer 11.

In this embodiment, the outer lateral surface (e.g., outer lateral surface 12s1 or outer lateral surface 12s2) of the first circuit layer 12 is covered by the first passivation layer 11 and/or by the first protection layer 13, which may prevent from oxidation of the first circuit layer 12 due to exposure of the first circuit layer 12. Therefore, the reliability of the semiconductor package structure 1a may be improved.

Figure 4:
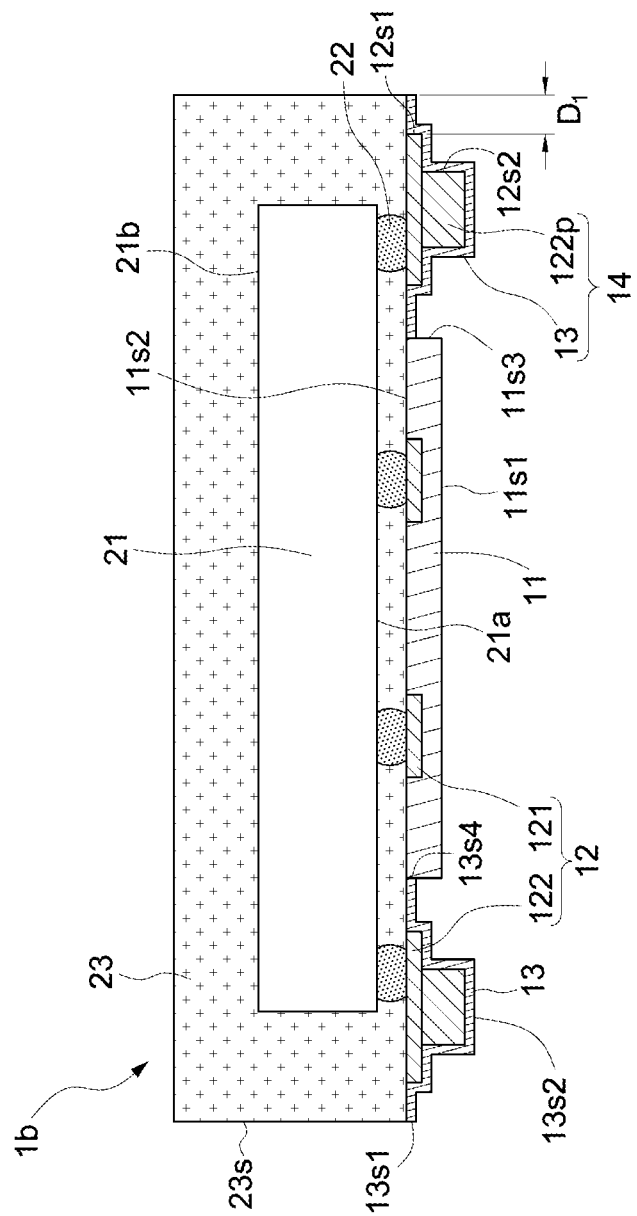
FIG. 4 illustrates a cross-sectional view of a semiconductor package structure according to some embodiments of the present disclosure.

FIG. 4 illustrates a cross-sectional view of a semiconductor package structure 1b according to some embodiments of the present disclosure. The semiconductor package structure 1b is similar to the semiconductor package structure 1a shown in FIG. 1 through FIG. 3, except for the structure of substrate structure 10.

As shown in FIG. 4, a size or area of the first passivation layer 11 may be less than a size or area of the first encapsulant 23 from a bottom view. Thus, the outer lateral surface 11s3 of the first passivation layer 11 is recessed from the lateral surface 23s of the first encapsulant 23. Further, the first passivation layer 11 may be surrounded by the second portion 122 of the first circuit layer 12. The second portion 122 of the first circuit layer 12 may be spaced apart from the first passivation layer 11. In some embodiments, the lateral surface 13s1 of the first protection layer 13 may be coplanar with the lateral surface 23s of the first encapsulant 23. In some embodiments, the outer lateral surface 12s1 of the first circuit layer 12 is covered by the first protection layer 13. In some embodiments, the first protection layer 13 may be in contact with the lower surface of the first encapsulant 23. In some embodiments, the first protection layer 13 may be in contact with the outer lateral surface 11s3 of the first passivation layer 11. In some embodiments, the first protection layer 13 may extend from the outer lateral surface 12s1 of the first circuit layer 12 to the lateral surface 23s of the first encapsulant 23. In some embodiments, the lateral surface 13s4, which is opposite to the lateral surface 13s1, of the first protection layer 13 may be substantially coplanar with the outer lateral surface 11s3 of the first passivation layer 11.

Figure 4A:
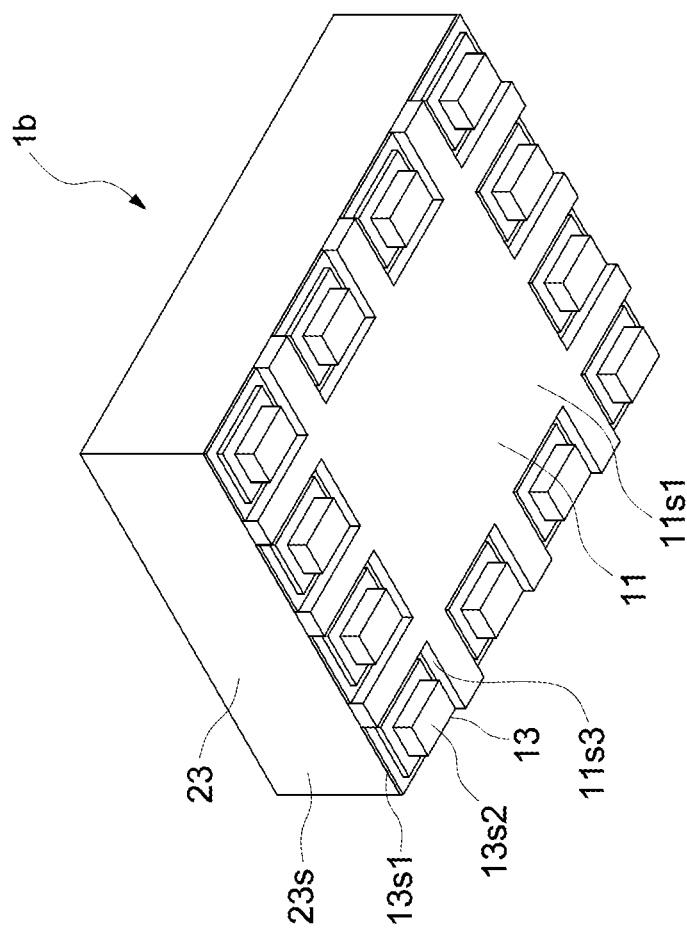
FIG. 4A illustrates a bottom perspective view of the semiconductor package structure of FIG. 4.

FIG. 4A illustrates a bottom perspective view of the semiconductor package structure 1b of FIG. 4. As shown in FIG. 4A, the lateral surface 13s1 of the first protection layer 13 may be coplanar with the lateral surface 23s of the first encapsulant 23. The outer lateral surface 11s3 of the first passivation layer 11 may be longitudinally exposed from the lateral surface 13s1 of the first protection layer 13.

Figure 5:
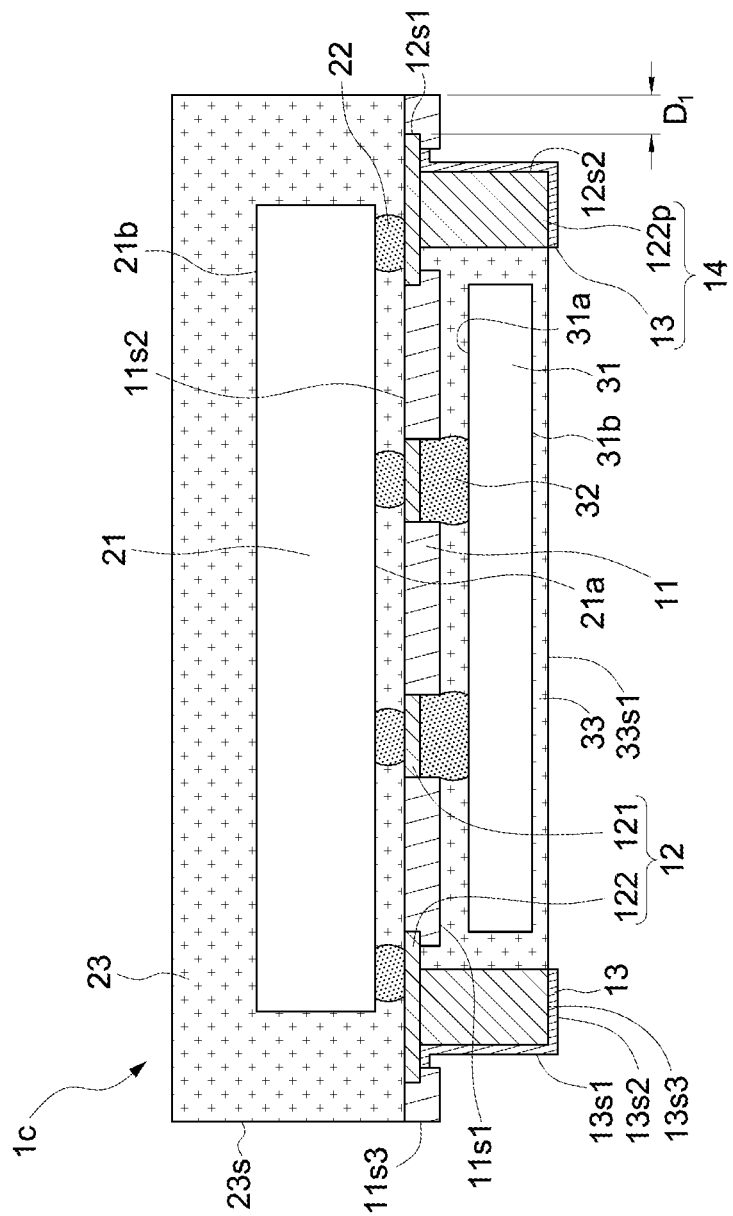
FIG. 5 illustrates a cross-sectional view of a semiconductor package structure according to some embodiments of the present disclosure.

FIG. 5 illustrates a cross-sectional view of a semiconductor package structure 1c according to some embodiments of the present disclosure. The semiconductor package structure 1c is similar to the semiconductor package structure 1a shown in FIG. 1 through FIG. 3, except that the semiconductor package structure 1c further includes a second semiconductor die 31, at least one connecting material 32 and a second encapsulant 33, and the solder wettable flank 14 has a greater height.

The second semiconductor die 31 may be disposed on the first surface 11s1 of the first passivation layer 11. The second semiconductor die 31 may be electrically connected to the first portion 121 of the first circuit layer 12 through the connecting material 32 (e.g., solder material). The second semiconductor die 31 may have a first surface 31a (e.g., an active surface) and a second surface 31b (e.g., a backside surface) opposite to the first surface 31a. The first surface 31a may face the first passivation layer 11. The second encapsulant 33 may be disposed on the first surface 11s1 of the first passivation layer 11 and cover the second semiconductor die 31. The second encapsulant 33 may be surrounded by the second portion 122 of the first circuit layer 12. The second encapsulant 33 may be in contact with the second portion 122 of the first circuit layer 12. In this embodiment, the outer lateral surface 12s1 of the first circuit layer 12 is covered by the first passivation layer 11, and the outer lateral surface 12s2 of the first circuit layer 12 is covered by the first protection layer 13. The first protection layer 13 may have a surface 13s3 (or may be referred to as an inner surface 13s3). In some embodiments, the surface 13s2 of the first protection layer 13 is not coplanar with a surface 33s1 of the second encapsulant 33. In some embodiments, the surface 13s3 of the first protection layer 13 is substantially coplanar with the surface 33s1 of the second encapsulant 33.

Figure 6:
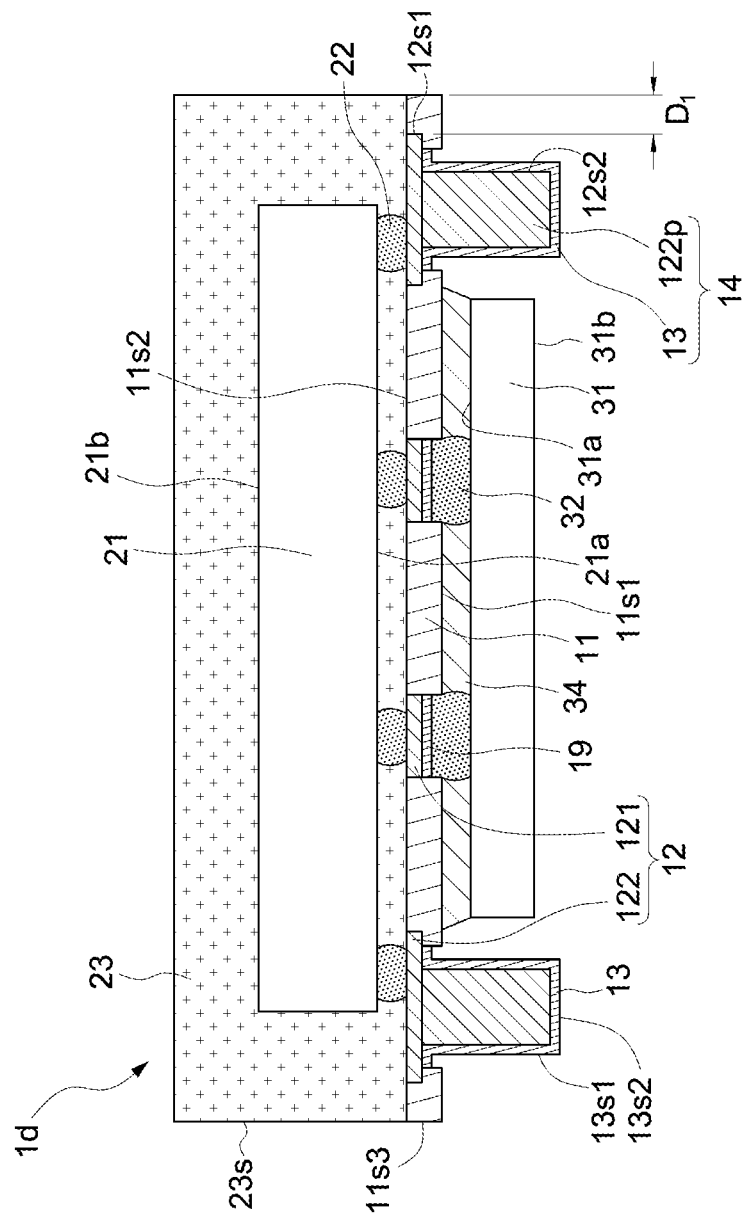
FIG. 6 illustrates a cross-sectional view of a semiconductor package structure according to some embodiments of the present disclosure.

FIG. 6 illustrates a cross-sectional view of a semiconductor package structure 1d according to some embodiments of the present disclosure. The semiconductor package structure 1d is similar to the semiconductor package structure 1c shown in FIG. 5 except that the second encapsulant 33 is replaced by an underfill 34.

The underfill 34 may be disposed on the first surface 11s1 of the first passivation layer 11. The underfill 34 may be disposed between the first surface 11s1 of the first passivation layer 11 and the first surface 31a of the second semiconductor die 31. The connecting material 32 may be sealed by the underfill 34. The underfill 34 may cover the first surface 31a of the second semiconductor die 31. In some embodiments, a surface finish layer 19 may be interposed between the first portion 121 of the first circuit layer 12 and the connecting material 32. A material of the surface finish layer 19 may be the same as or different from a material of the first protection layer 13. In some embodiments, the first portion 121 of the first circuit layer 12, the surface finish layer 19 and the connecting material 32 may be vertically aligned to each other.

Figure 7:
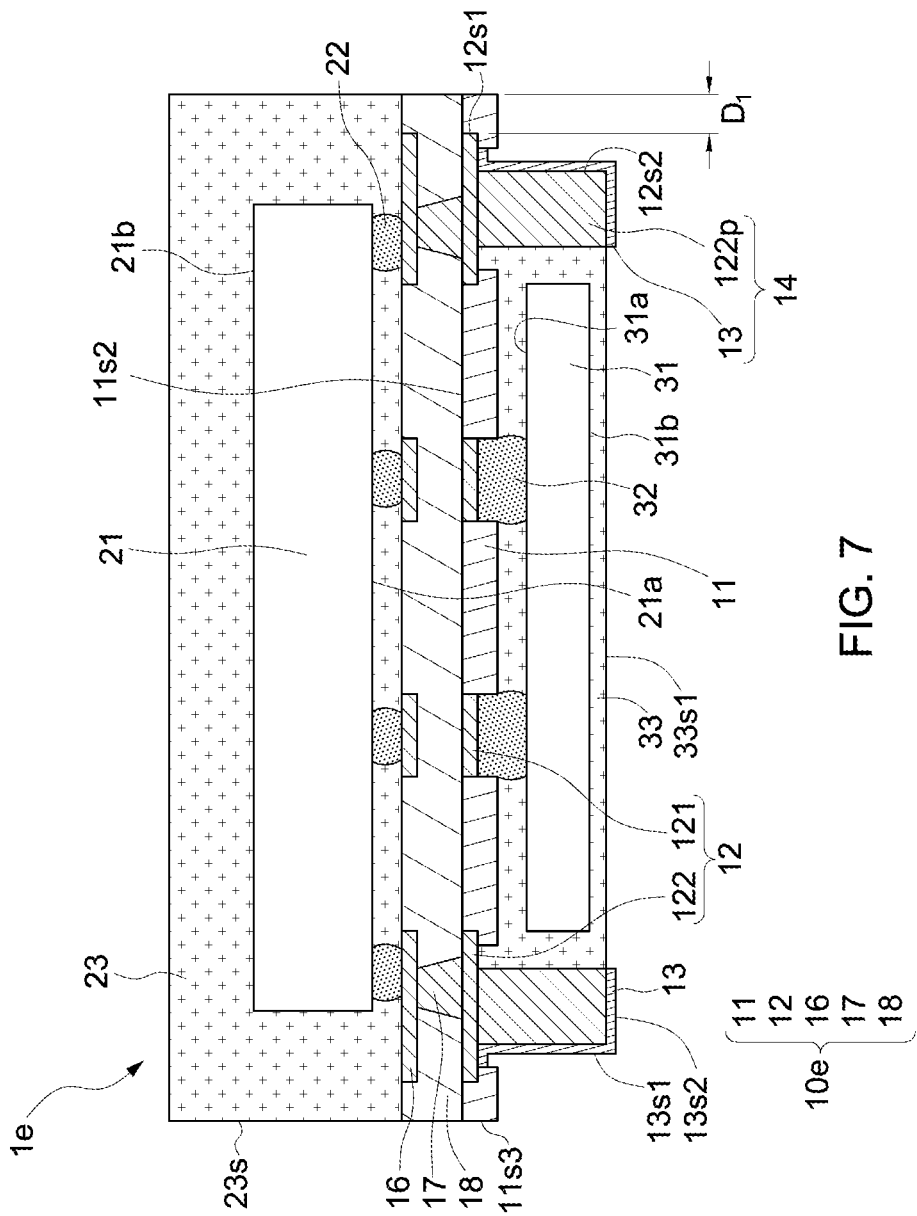
FIG. 7 illustrates a cross-sectional view of a semiconductor package structure according to some embodiments of the present disclosure.

FIG. 7 illustrates a cross-sectional view of a semiconductor package structure 1e according to some embodiments of the present disclosure. The semiconductor package structure 1e is similar to the semiconductor package structure 1c shown in FIG. 5 except for the structure of the substrate structure 10e.

In some embodiments, the substrate structure 10e may further include a second circuit layer 16, a conductive via 17 and a second passivation layer 18. The second passivation layer 18 may be disposed on the second surface 11s2 of the first passivation layer 11. The material of the second passivation layer 18 may be the same as or similar to that of the first passivation layer 11. The second circuit layer 16 may be disposed adjacent to a top surface of the second passivation layer 18 and electrically connected to the first circuit layer 12 through the conductive via 17. The first semiconductor die 21 may be separated from the first passivation layer 11 by the second passivation layer 18. The first semiconductor die 21 may be attached to the top surface of the second passivation layer 18, and electrically connected to the first circuit layer 12 through the second circuit layer 16 and the conductive via 17.

Figure 8:
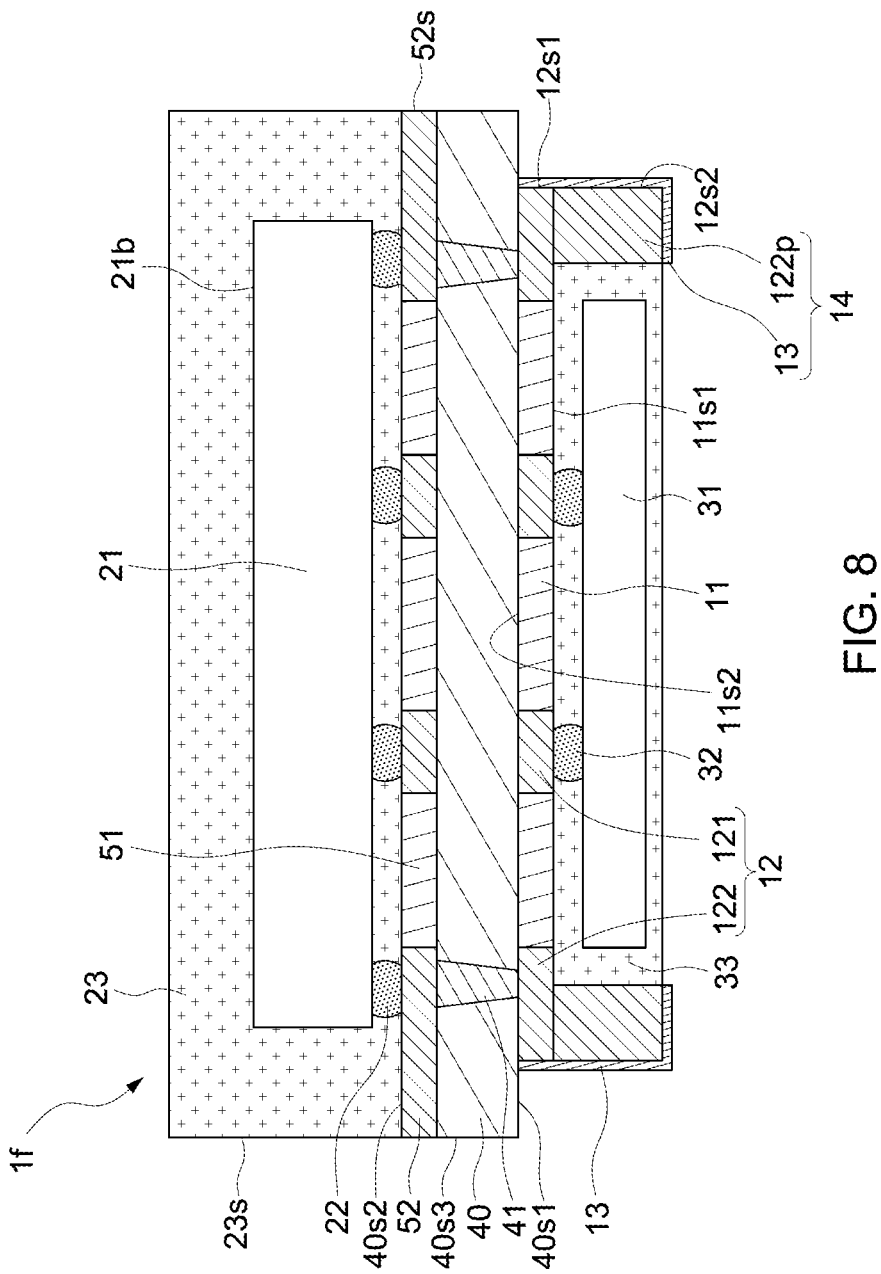
FIG. 8 illustrates a cross-sectional view of a semiconductor package structure according to some embodiments of the present disclosure.

FIG. 8 illustrates a cross-sectional view of a semiconductor package structure 1f according to some embodiments of the present disclosure. The semiconductor package structure 1f is similar to the semiconductor package structure 1e shown in FIG. 7 except that the semiconductor package structure 1f further includes a core substrate 40, a conductive via 41, a second passivation layer 51 and a second circuit layer 52.

The core substrate 40 is disposed on the second surface 11s2 of the first passivation layer 11. The core substrate 40 may be disposed between the first passivation layer 11 and the first semiconductor die 21. The core substrate 40 has a first surface 40s1, a second surface 40s2 opposite to the first surface 40s1 and a lateral surface 40s3 extending between the first surface 40s1 and the second surface 40s2. The first surface 40s1 may face the second semiconductor die 31. The second surface 40s2 may face the first semiconductor die 21. The conductive via 41 may extend through the core substrate 40 from the first surface 40s1 to the second surface 40s2. The second passivation layer 51 may be disposed on the second surface 40s2 of the core substrate 40. The second passivation layer 51 may be spaced apart from the first passivation layer 11 by the core substrate 40. The material of the second passivation layer 51 may be the same as or similar to that of the first passivation layer 11. The second circuit layer 52 may be disposed on the second surface 40s2 of the core substrate 40. The second circuit layer 52 may be electrically connected to the first circuit layer 12 through the conductive via 41. In some embodiments, the lateral surface 23s of the first encapsulant 23 may be substantially coplanar with the lateral surface 40s3 of the core substrate 40. In some embodiments, the lateral surface 52s of the second circuit layer 52 may be substantially coplanar with the lateral surface 40s3 of the core substrate 40. In some embodiments, the first protection layer 13 is in contact with the first surface 40s1 of the core substrate 40. In some embodiments, the outer lateral surface 12s1 of the first circuit layer 12 is substantially coplanar with the outer lateral surface 12s2 of the first circuit layer 12. Thus, a portion of the first surface 40s1 of the core substrate 40 may be exposed. In some embodiments, the first protection layer 13 is spaced apart from the first passivation layer 11.

Figure 9:
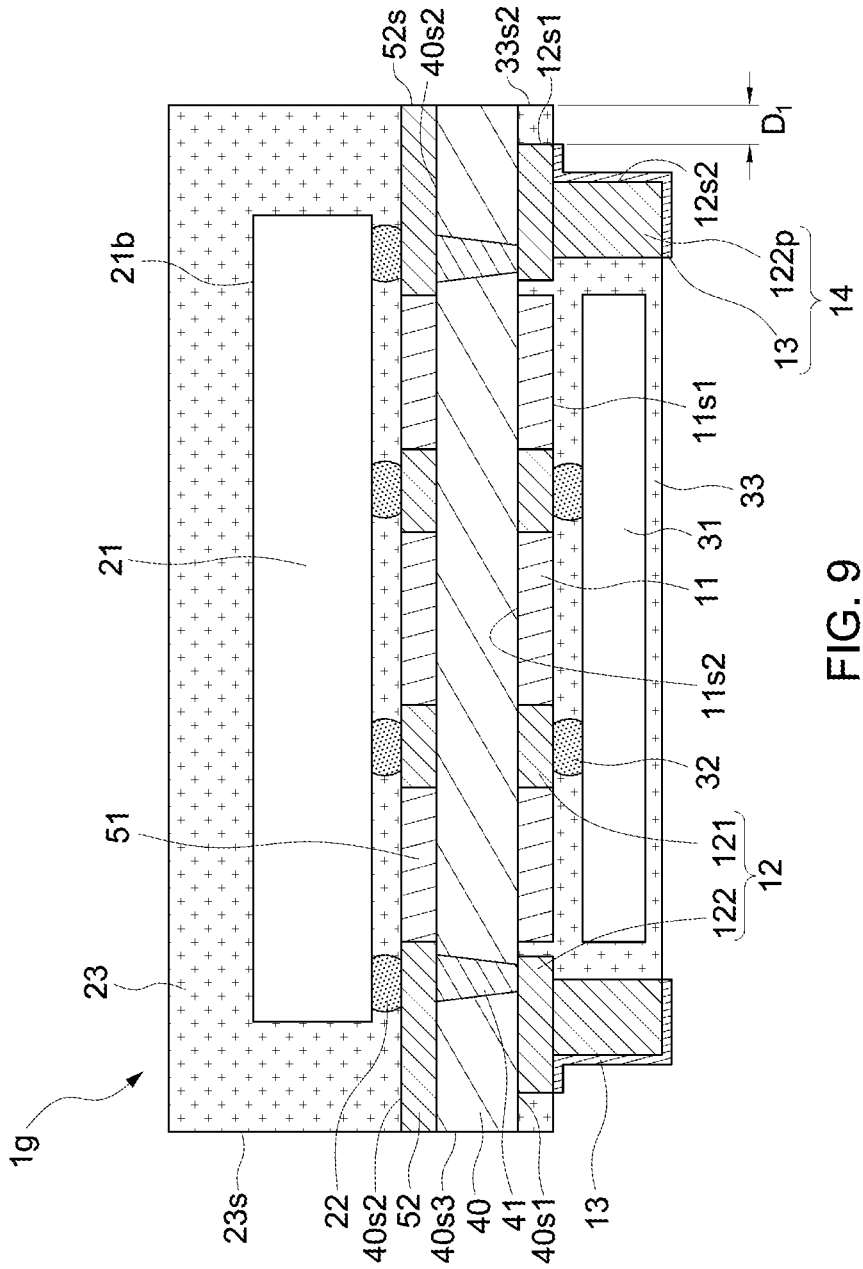
FIG. 9 illustrates a cross-sectional view of a semiconductor package structure according to some embodiments of the present disclosure.

FIG. 9 illustrates a cross-sectional view of a semiconductor package structure 1g according to some embodiments of the present disclosure. The semiconductor package structure 1g is similar to the semiconductor package structure 1f shown in FIG. 8 except for the structure of the second portion 122 of the first circuit layer 12 and the structure of the second encapsulant 33.

In some embodiments, the outer lateral surface 12s1 of the first circuit layer 12 is displaced with the outer lateral surface 12s2 of the first circuit layer 12, and there is a predetermined distance $D_1$ between the outer lateral surface 12s1 of the first circuit layer 12 and the lateral surface 40s3 of the core substrate 40. In addition, the second encapsulant 33 may be in contact with the first surface 40s1 of the core substrate 40, and a portion of the second encapsulant 33 may cover the outer lateral surface 12s1 of the first circuit layer 12. The second encapsulant 33 may include a lateral surface 33s2. In some embodiments, the lateral surface 33s2 of the second encapsulant 33 may be substantially coplanar with the lateral surface 40s3 of the core substrate 40. In some embodiments, the lateral surface 33s2 of the second encapsulant 33 may be substantially coplanar with the surface 23s of the first encapsulant 23.

Figure 10:
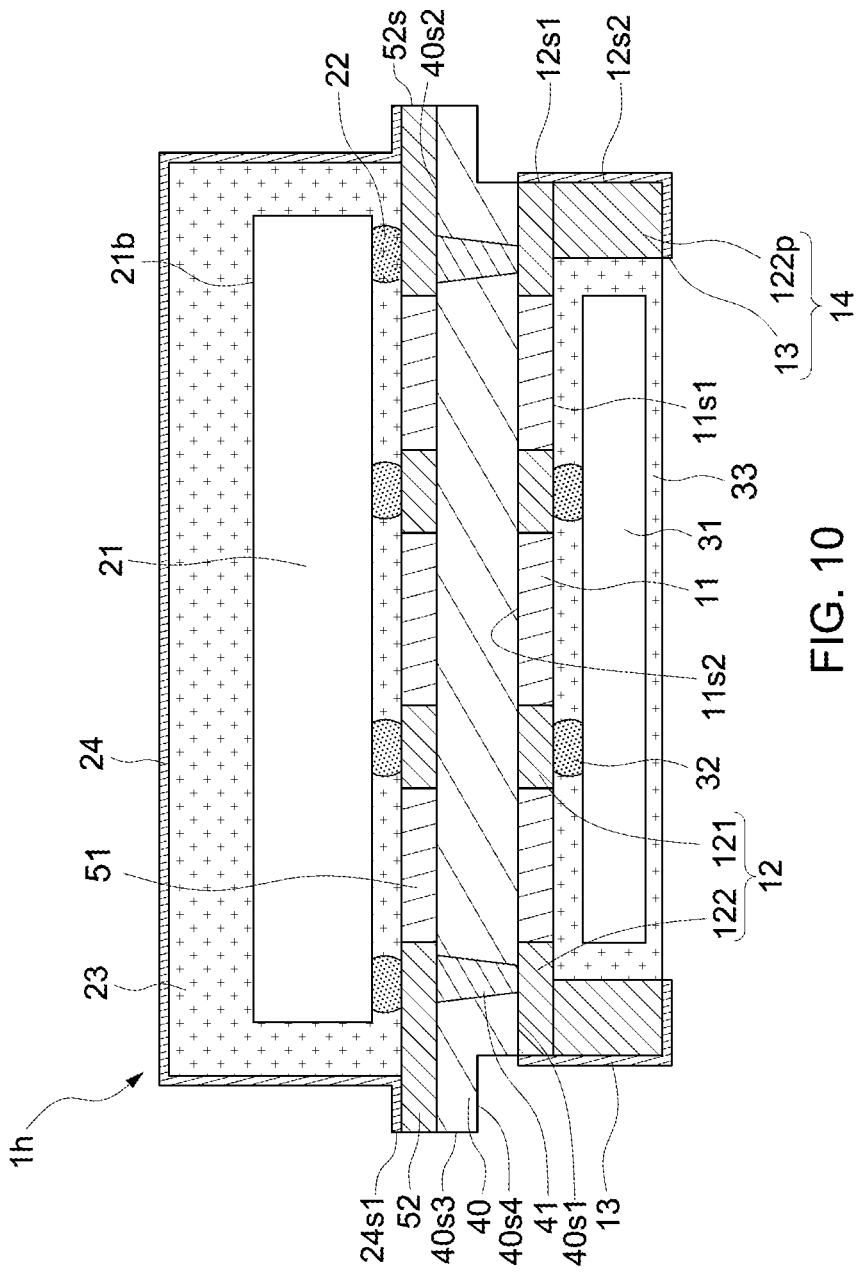
FIG. 10 illustrates a cross-sectional view of a semiconductor package structure according to some embodiments of the present disclosure.

FIG. 10 illustrates a cross-sectional view of a semiconductor package structure 1h according to some embodiments of the present disclosure. The semiconductor package structure 1h is similar to the semiconductor package structure 1g shown in FIG. 9 except that the semiconductor package structure 1h further includes a second protection layer 24, and the second encapsulant 33 may not contact the first surface 40s1 of the core substrate 40. In addition, a portion of the core substrate 40 is removed such that the core substrate 40 has a surface 40s4 recessed from the first surface 40s1.

The second protection layer 24 may be disposed on the second surface 40s2 of the core substrate 40 and on the second circuit layer 52. The second protection layer 24 may cover the first encapsulant 23 and the second circuit layer 52. In some embodiments, the second protection layer 24 may include an anti-oxidation layer. The material of the second protection layer 24 may be the same as or similar to that of the first protection layer 13. A lateral surface 24s1 of the second protection layer 24 is substantially coplanar with the lateral surface 52s of the second circuit layer 52 and the lateral surface 40s3 of the core substrate 40. A portion of the first surface 40s1 of the core substrate 40 is exposed. Further, the surface 40s4 is separated from the first protection layer 13.

Figure 11:
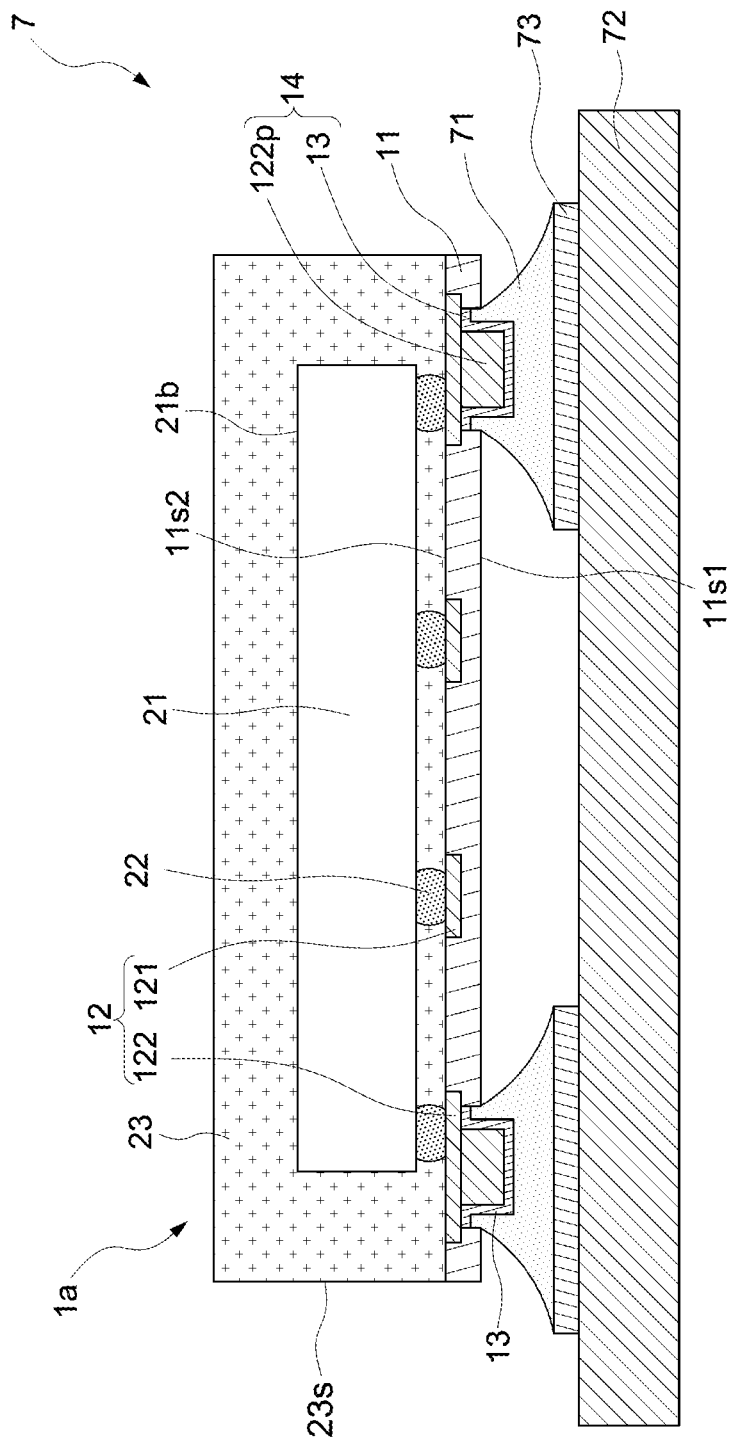
FIG. 11 illustrates an assembly structure of a semiconductor package structure and a carrier according to some embodiments of the present disclosure.

FIG. 11 illustrates an assembly structure 7 of a semiconductor package structure 1a and a carrier 72 according to some embodiments of the present disclosure. The semiconductor package structure 1a of FIG. 11 is similar to the semiconductor package structure 1a shown in FIG. 1.

The carrier 72 may be a motherboard such as a printed circuit board (PCB). The carrier 72 may include a bonding pad 73. The solder 71 may be disposed on the first protection layer 13 of the solder wettable flank 14. The solder 71 may be configured to correspond to the bonding pad 73 of the carrier 72. The solder 71 may be disposed between the first protection layer 13 and the bonding pad 73 of the carrier 72. The solder 71 may fill the depression structure 15 of the substrate structure 10. In some embodiments, after the solder 71 is bonded to the bonding pad 73, the solder 71 may exceed the outer lateral surface 23s of the first encapsulant 23 from a top view. That is, the solder 71 is visible from a top view. After the solder 71 is bonded to the bonding pad 73, the solder 71 may be tapered along a direction from the first surface 11s1 toward the second surface 11s2 of the first passivation layer 11, and may be detected from one side of the assembly structure 7.

FIG. 12 through FIG. 15 illustrate a method for manufacturing a semiconductor package structure 1a according to some embodiments of the present disclosure. In some embodiments, the method is for manufacturing a semiconductor package structure such as the semiconductor package structure 1a shown in FIG. 1 to FIG. 3.

Referring to FIG. 12, a carrier 61 and a conductive foil 62 are provided. The carrier 61 may include, for example, a glass substrate, a plastic substrate, a ceramic substrate or other suitable substrates. The conductive foil 62 is disposed on the carrier 61. The conductive foil 62 may include metal, such as copper or other suitable materials. Then, a first circuit layer 12, which includes a first portion 121 and a second portion 122, may be formed on the conductive foil 62 and may expose a portion of the conductive foil 62. Then, a first passivation layer 11 may be formed or disposed on the conductive foil 62 to cover the first circuit layer 12 and the exposed portion of the conductive foil 62. Then, the first passivation layer 11 may be patterned to define at least one opening 111 to expose a portion of the second portion 122 of the first circuit layer 12. That is, a size of the opening 111 of the first passivation layer 11 may be less than a size of the second portion 122 of the first circuit layer 12. As shown in FIG. 12, the first passivation layer 11 may have a first surface 11s1 and a second surface 11s2 opposite to the first surface 11s1. The second surface 11s2 of the first passivation layer 11 may face and contact the conductive foil 62.

Referring to FIG. 13, multiple protruding portion(s) 122p may be formed on the second portion 122 of the first circuit layer 12 in the opening 111 of the first passivation layer 11 by, for example, plating. The protruding portion(s) 122p may protrude from the second portion 122 of the first circuit layer 12. The protruding portion 122p of the first circuit layer 12 may be spaced apart from the first passivation layer 11. That is, the protruding portion 122p does not fill the opening 111, and thus, the protruding portion 122p does not contact the first passivation layer 11. Then, a first protection layer 13 may be formed on the second portion 122 of the first circuit layer 12 such that the solder wettable flank 14 is produced. The first protection layer 13 may be conformally formed on the protruding portion 122p of the first circuit layer 12 and in contact with the first passivation layer 11. As shown in FIG. 13, the outer lateral surface 12s1 of the first circuit layer 12 is covered by the first passivation layer 11, and the outer lateral surface 12s2 of the first circuit layer 12 is covered by the first protection layer 13.

Referring to FIG. 14, the carrier 61 and the conductive foil 62 are removed such that the second surface 11s2 of the first passivation layer 11 is exposed. Meanwhile, a substrate structure 10 is obtained. Then, a first semiconductor die 21 and conductive terminal(s) 22 may be formed on the second surface 11s2 of the first passivation layer 11 of the substrate structure 10. The conductive terminal(s) 22 may be attached to the first portion 121 and the second portion 122 of the first circuit layer 12. Thus, the first semiconductor die 21 is electrically connected to the first circuit layer 12 by chip-chip bonding. Then, a first encapsulant 23 may be formed on the second surface 11s2 of the first passivation layer 11 to cover the first semiconductor die 21, the conductive terminal (s) 22 and the second surface 11s2 of the first passivation layer 11.

Figure 15:
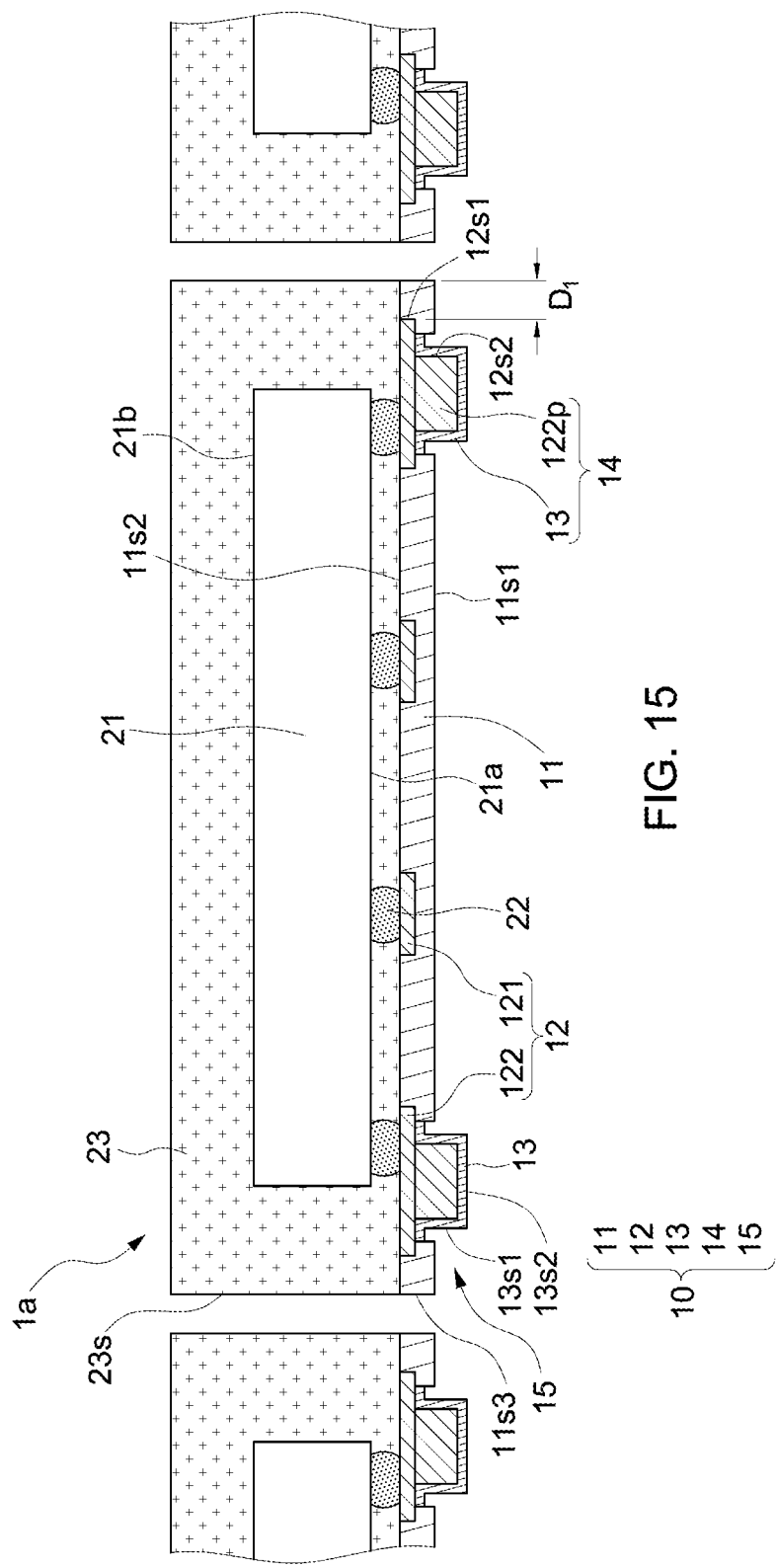
FIG. 15 illustrates one or more stages of an example of a method for manufacturing a semiconductor package structure according to some embodiments of the present disclosure.

Referring to FIG. 15, a singulation process may be performed such that a plurality of semiconductor package structures 1a are produced. The singulation process may include sawing the first encapsulant 23 and the first passivation layer 11. After the singulation process, the outer lateral surface 11s3 of the first passivation layer 11 is defined. As shown in FIG. 15, after the singulation process, there is a predetermined distance $D_1$ between the outer lateral surface 12s1 of the first circuit layer 12 and the outer lateral surface 11s3 of the first passivation layer 11.

FIG. 16 through FIG. 19 illustrate a method for manufacturing a semiconductor package structure 1b according to some embodiments of the present disclosure. In some embodiments, the method is for manufacturing a semiconductor package structure such as the semiconductor package structure 1b shown in FIG. 4.

Figure 16:
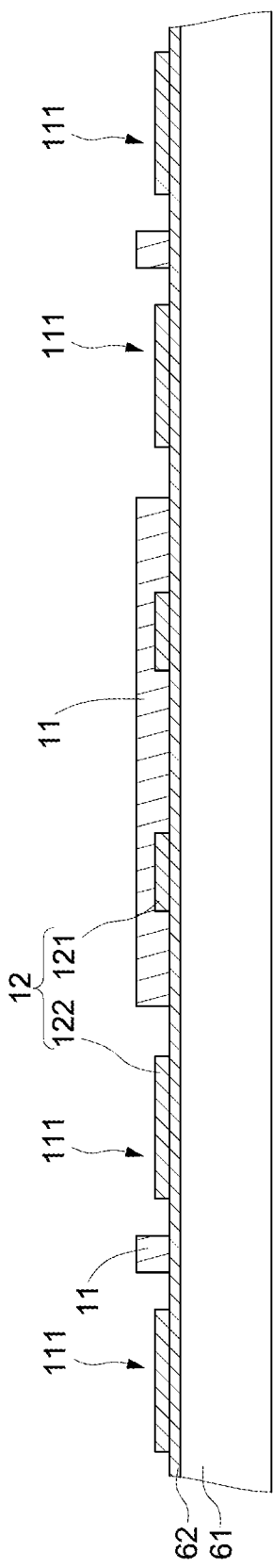
FIG. 16 illustrates one or more stages of an example of a method for manufacturing a semiconductor package structure according to some embodiments of the present disclosure.

Referring to FIG. 16, a carrier 61 and a conductive foil 62 are provided. Then, a first circuit layer 12 may be formed on the conductive foil 62, and may expose a portion of the conductive foil 62. Then, a first passivation layer 11 may be formed or disposed on the conductive foil 62 to cover the first circuit layer 12 and the exposed portion of the conductive foil 62. Then, the first passivation layer 11 may be patterned to define at least one opening 111 to expose the second portion 122 of the first circuit layer 12 and portions of the conductive foil 62. That is, a size of the opening 111 of the first passivation layer 11 may be greater than a size of the second portion 122 of the first circuit layer 12. Thus, the first passivation layer 11 may cover the first portion 121 of the first circuit layer 12 and expose the second portion 122 of the first circuit layer 12. In some embodiments, the second portion 122 of the first circuit layer 12 is fully exposed from the first passivation layer 11.

Figure 17:
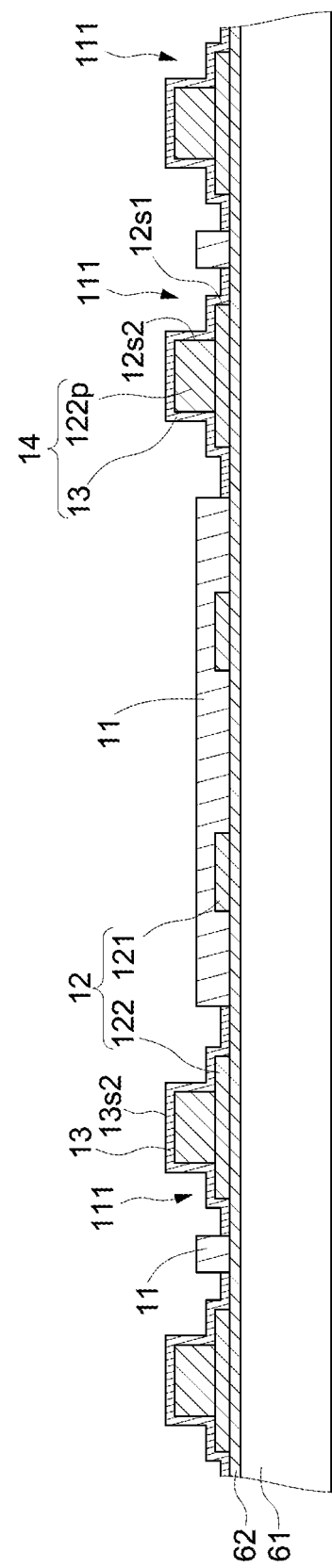
FIG. 17 illustrates one or more stages of an example of a method for manufacturing a semiconductor package structure according to some embodiments of the present disclosure.

Referring to FIG. 17, multiple protruding portion(s) 122$p$ may be formed on the second portion 122 of the first circuit layer 12 in the opening 111 of the first passivation layer 11 by, for example, plating. Then, a first protection layer 13 may be formed on the second portion 122 of the first circuit layer 12 such that the solder wettable flank 14 is produced. The first protection layer 13 may be conformally formed on the first circuit layer 12 and on the exposed portion of the conductive foil 62 in the opening 111 of the first passivation layer 11. As shown in FIG. 17, the outer lateral surface 12$s$1 of the first circuit layer 12 and the outer lateral surface 12$s$2 of the first circuit layer 12 are covered by the first protection layer 13.

Figure 18:
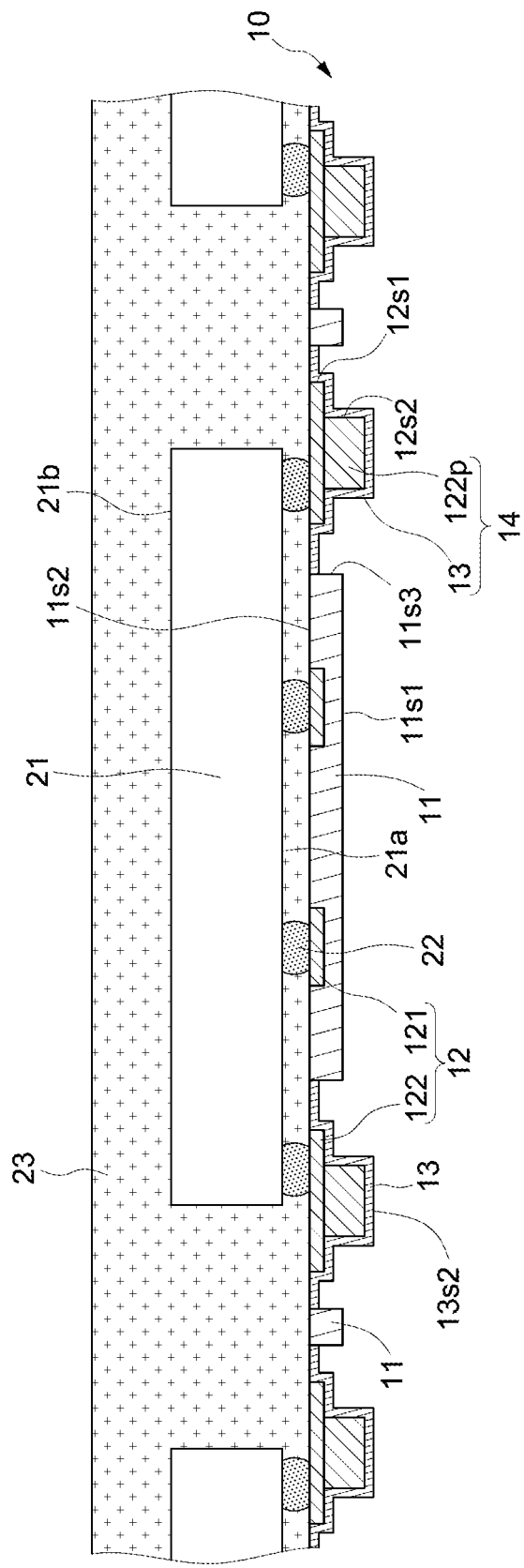
FIG. 18 illustrates one or more stages of an example of a method for manufacturing a semiconductor package structure according to some embodiments of the present disclosure.

Referring to FIG. 18, the carrier 61 and the conductive foil 62 are removed such that the second surface 11$s$2 of the first passivation layer 11 is exposed. Meanwhile, a substrate structure 10 is obtained. Then, a first semiconductor die 21 and conductive terminal(s) 22 may be formed on the second surface 11$s$2 of the first passivation layer 11 of the substrate structure 10. Then, a first encapsulant 23 may be formed on the second surface 11$s$2 of the first passivation layer 11 to cover the first semiconductor die 21, the conductive terminal(s) 22, the second surface 11$s$2 of the first passivation layer 11 and the first protection layer 13.

Figure 19:
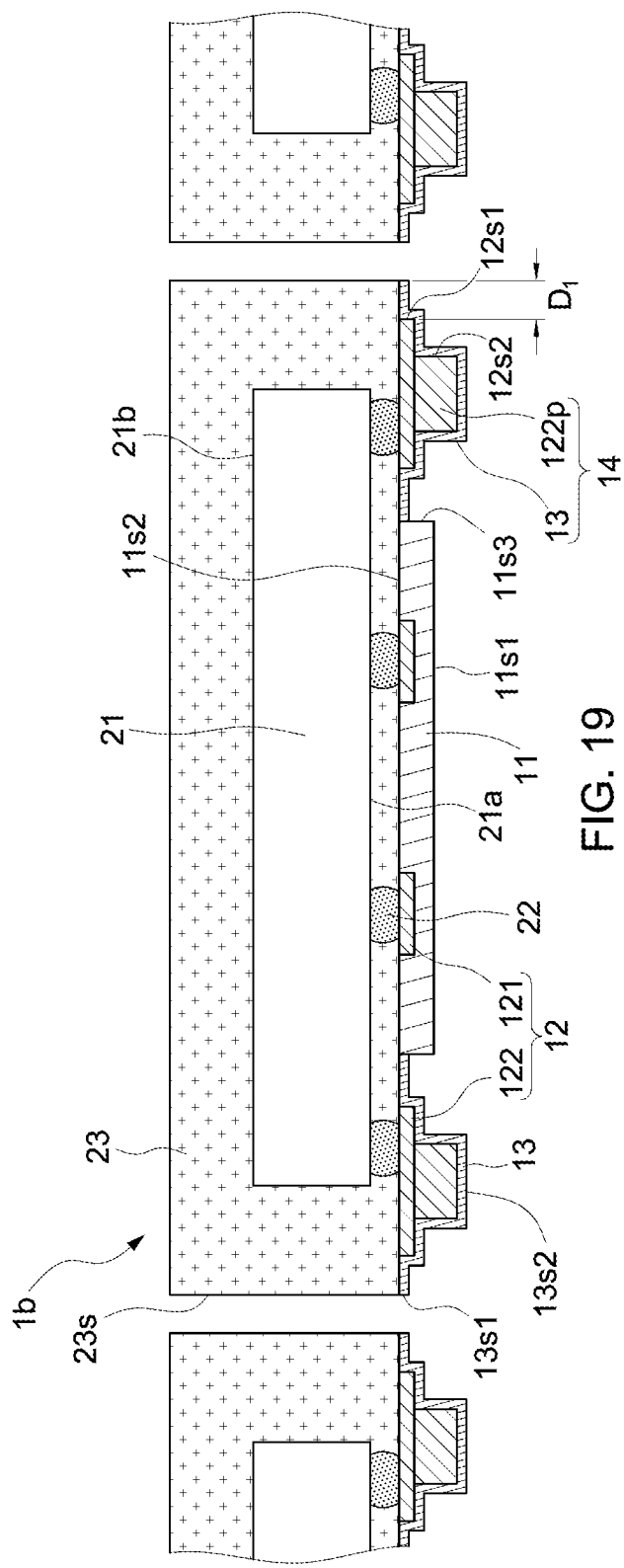
FIG. 19 illustrates one or more stages of an example of a method for manufacturing a semiconductor package structure according to some embodiments of the present disclosure.

Referring to FIG. 19, a singulation process may be performed to form a plurality of semiconductor package structures 1$b$. The singulation process may include sawing the first encapsulant 23, the first passivation layer 11 and the first protection layer 13. The first passivation layer 11 located between two adjacent protruding portions 122$p$ may be completely removed such that the lateral surface 13$s$1 of the first protection layer 13 is exposed after the singulation process. After the singulation process, there is a predetermined distance $D_1$ between the outer lateral surface 12$s$1 of the first circuit layer 12 and the lateral surface 23$s$ of the first encapsulant 23.

FIG. 20 through FIG. 26 illustrate a method for manufacturing a semiconductor package structure 1$c$ according to some embodiments of the present disclosure. In some embodiments, the method is for manufacturing a semiconductor package structure such as the semiconductor package structure 1$c$ shown in FIG. 5.

Referring to FIG. 20, a carrier 61 and a conductive foil 62 are provided. Then, a first circuit layer 12 may be formed on the conductive foil 62, and may expose a portion of the conductive foil 62. Then, a first passivation layer 11 may be formed or disposed on the conductive foil 62 to cover the first circuit layer 12 and the exposed portion of the conductive foil 62. The first passivation layer 11 may expose the first portion 121 of the first circuit layer 12 and expose a portion of the second portion 122 of the first circuit layer 12.

Referring to FIG. 21, multiple protruding portion(s) 122$p$ may be formed on the second portion 122 of the first circuit layer 12. The protruding portion 122$p$ may protrude from the second portion 122 of the first circuit layer 12. The protruding portion 122$p$ of the first circuit layer 12 may be spaced apart from the first passivation layer 11.

Figure 22:
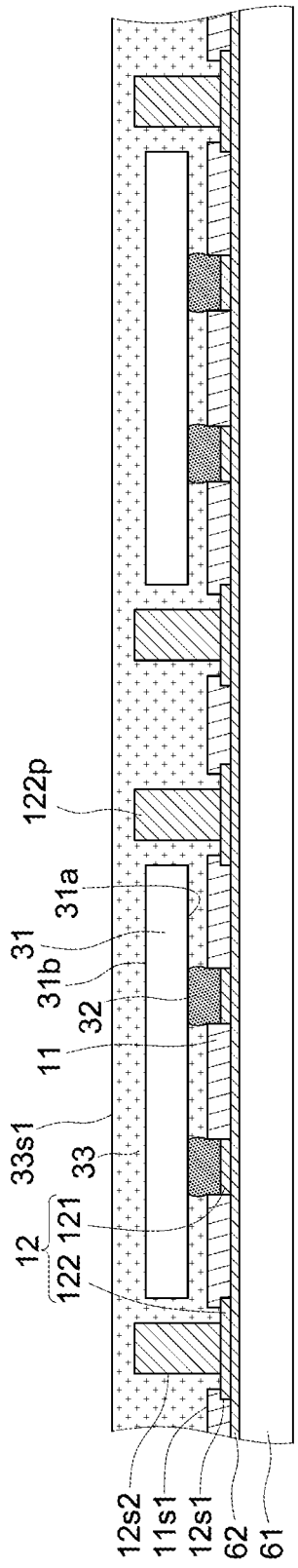
FIG. 22 illustrates one or more stages of an example of a method for manufacturing a semiconductor package structure according to some embodiments of the present disclosure.

Referring to FIG. 22, a second semiconductor die 31 and at least one connecting material 32 (e.g., solder material) may be formed on the first surface 11$s$1 of the first passivation layer 11. The second semiconductor die 31 may be electrically connected to the first portion 121 of the first circuit layer 12 through the connecting material 32. Then, a second encapsulant 33 may be formed on the first surface 11$s$1 of the first passivation layer 11 to cover the second semiconductor die 31, the connecting material 32, the protruding portion(s) 122$p$ of the first circuit layer 12 and first surface 11$s$1 of the first passivation layer 11. The second encapsulant 33 may fill the openings defined by the first passivation layer 11. For example, a portion of the second encapsulant 33 may be disposed between the protruding portion(s) 122$p$ of the second portion 122 of the first circuit layer 12 and the first passivation layer 11.

Figure 23:
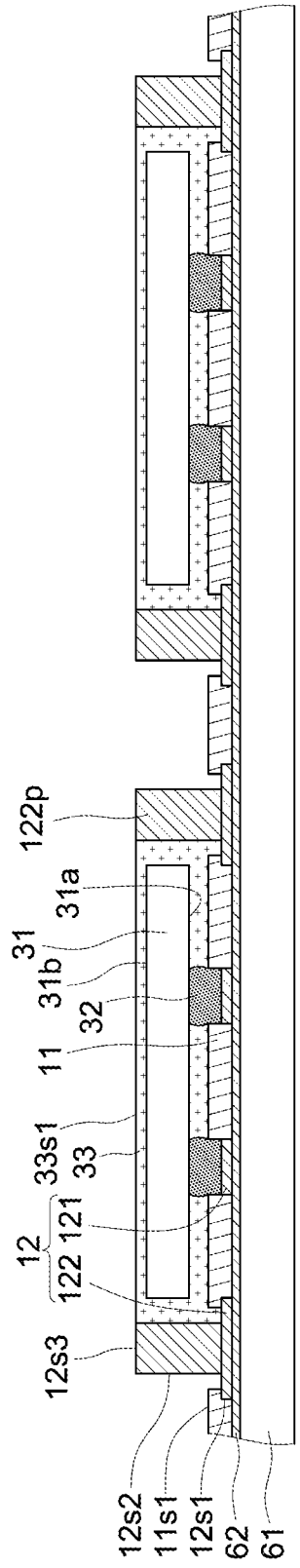
FIG. 23 illustrates one or more stages of an example of a method for manufacturing a semiconductor package structure according to some embodiments of the present disclosure.

Referring to FIG. 23, the second encapsulant 33 may be thinned from its surface 33$s$1 so that the surface 33$s$1 of the second encapsulant 33 may be substantially coplanar with the surface 12$s$3 of the protruding portion 122$p$. That is, the surface 12$s$3 of the protruding portion 122$p$ may be exposed from the surface 33$s$1 of the second encapsulant 33. Then, a portion of the second encapsulant 33 disposed between the protruding portions 122$p$ may be removed such that a portion of a surface 12$s$2 of the protruding portion 122$p$, a portion of the first surface 11$s$1 of the first passivation layer 11 are exposed.

Figure 24:
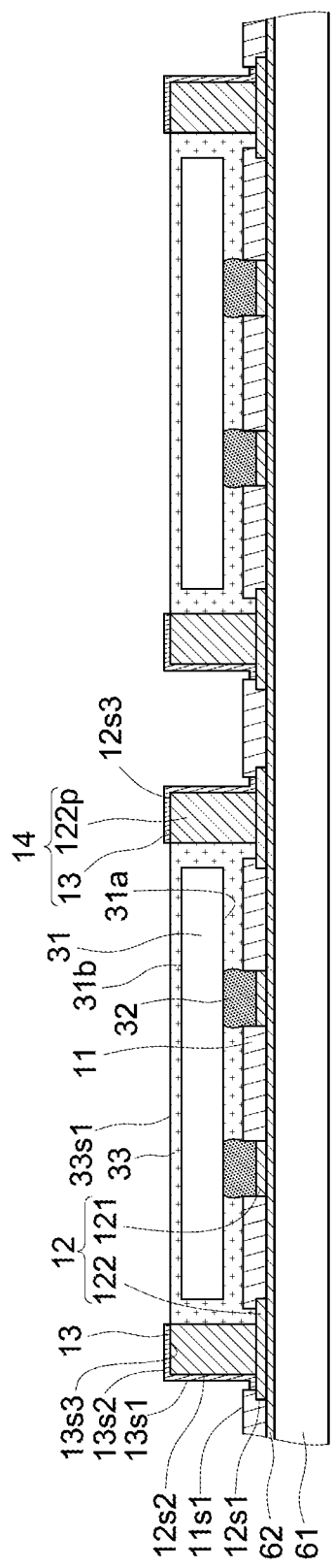
FIG. 24 illustrates one or more stages of an example of a method for manufacturing a semiconductor package structure according to some embodiments of the present disclosure.

Referring to FIG. 24, a first protection layer 13 may be formed on the second portion 122 of the first circuit layer 12 such that the solder wettable flank 14 is produced. The first protection layer 13 may be conformally formed on the surfaces 12$s$2, 12$s$3 of the protruding portion 122$p$ and the second portion 122 of the first circuit layer 12. The surface 13$s$2 of the first protection layer 13 is not coplanar with the surface 33$s$1 of the second encapsulant 33.

Figure 25:
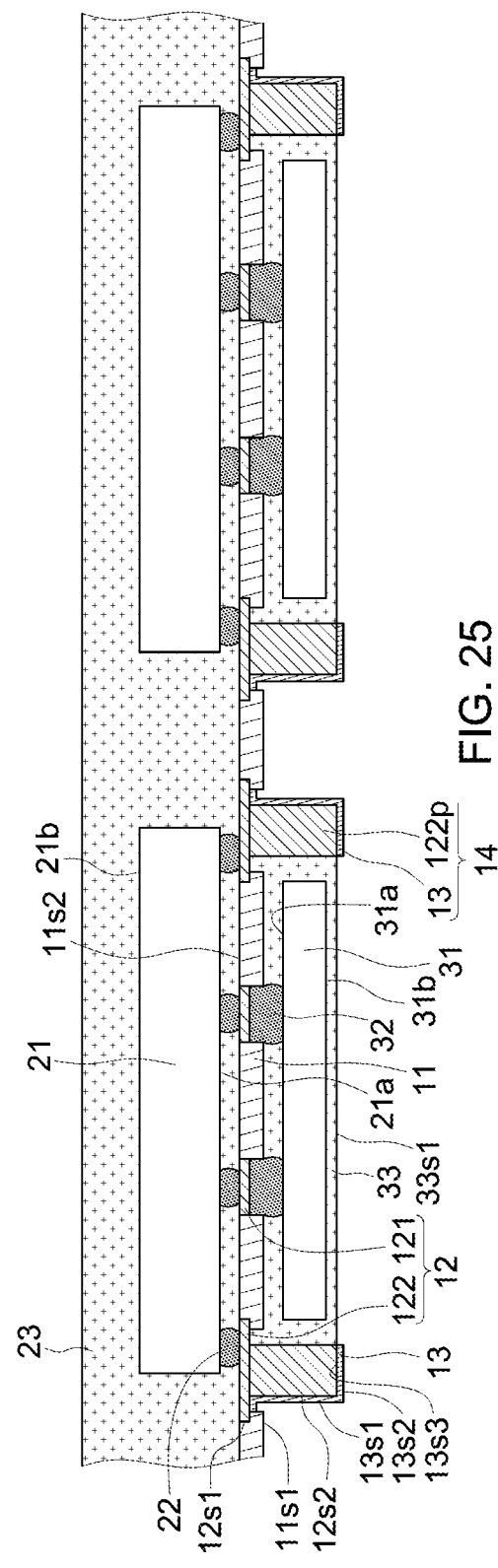
FIG. 25 illustrates one or more stages of an example of a method for manufacturing a semiconductor package structure according to some embodiments of the present disclosure.

Referring to FIG. 25, the carrier 61 and the conductive foil 62 are removed such that the second surface 11$s$2 of the first passivation layer 11 is exposed. Then, a first semiconductor die 21 and conductive terminal(s) 22 may be formed on the second surface 11$s$2 of the first passivation layer 11. Then, a first encapsulant 23 may be formed on the second surface 11$s$2 of the first passivation layer 11 to cover the first semiconductor die 21, the conductive terminal(s) 22 and the second surface 11$s$2 of the first passivation layer 11.

Figure 26:
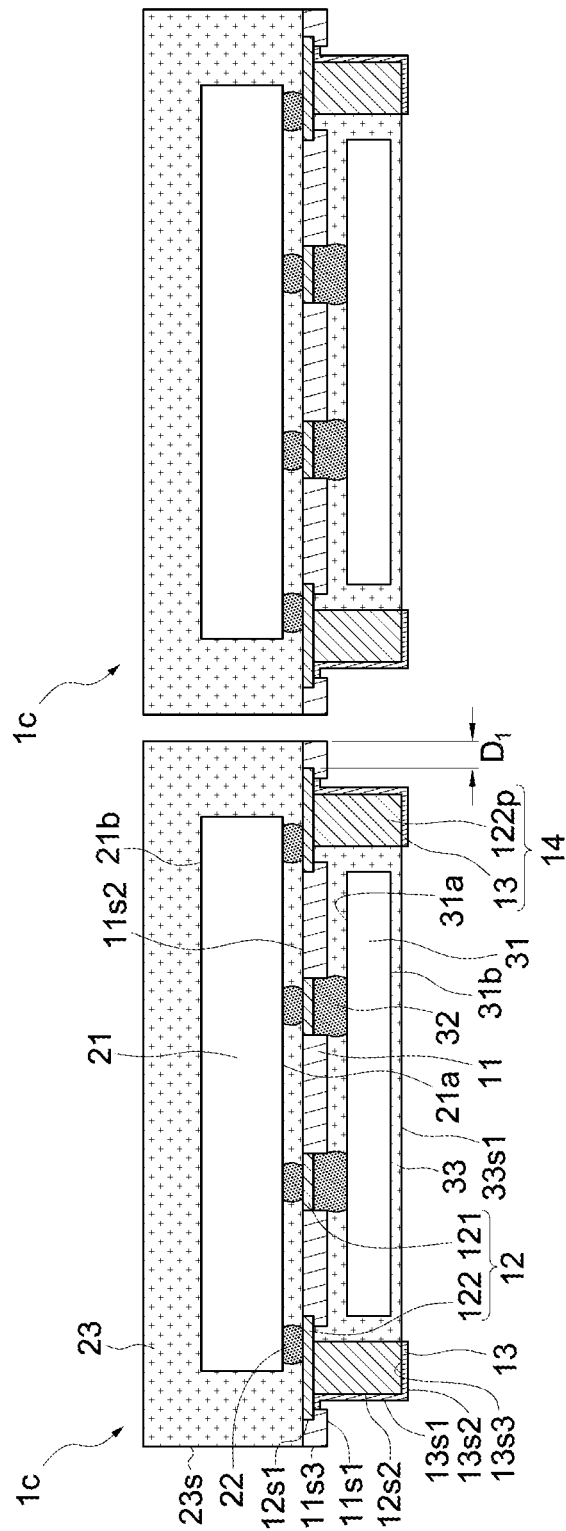
FIG. 26 illustrates one or more stages of an example of a method for manufacturing a semiconductor package structure according to some embodiments of the present disclosure.

Referring to FIG. 26, a singulation process may be performed to form a plurality of semiconductor package structures 1$c$. The singulation process may include sawing the first encapsulant 23 and first passivation layer 11. As shown in FIG. 26, the outer lateral surface 12$s$1 of the first circuit layer 12 is covered by the first passivation layer 11, and the outer lateral surface 12$s$2 of the first circuit layer 12 is covered by the first protection layer 13. After the singulation process, there is a predetermined distance $D_1$ between the outer lateral surface 12$s$1 of the first circuit layer 12 and the outer lateral surface 11$s$3 of the first passivation layer 11.

FIG. 27 through FIG. 30 illustrate a method for manufacturing a semiconductor package structure 1$h$ according to some embodiments of the present disclosure. In some embodiments, the method is for manufacturing a semiconductor package structure such as the semiconductor package structure 1$h$ shown in FIG. 10.

Referring to FIG. 27, a core substrate 40 is provided. The core substrate 40 has a first surface 40$s$1 and a second surface 40$s$2 opposite to the first surface 40$s$1. The first surface 40$s$1 of the core substrate 40 may face the first surface 11$s$1 of the first passivation layer 11. A conductive via 41 may be embedded in the core substrate 40 and extend between the first surface 40$s$1 and the second surface 40$s$2 of the core substrate 40. A first passivation layer 11 and a first circuit layer 12 may be formed on the first surface 40$s$1 of the core substrate 40. A second passivation layer 51 and a second circuit layer 52 may be formed on the second surface 40s2 of the core substrate 40. Then, protruding portion(s) 122p may be formed on the second portion 122 of the first circuit layer 12.

Referring to FIG. 28, a first semiconductor die 21, conductive terminal 22(s) and a first encapsulant 23 may be formed on the second surface 40s2 of the core substrate 40. A second semiconductor die 31, at least one connecting material 32 (e.g., solder material) and a second encapsulant 33 may be formed on the first surface 40s1 of the core substrate 40 (or formed on the first surface 11s1 of the first passivation layer 11). Then, the second encapsulant 33 may be thinned from its surface 33s1 so that the surface 33s1 of the second encapsulant 33 may be substantially coplanar with the surface 12s3 of the protruding portion 122p. That is, the surface 12s3 of the protruding portion 122p may be exposed from the surface 33s1 of the second encapsulant 33. Then, a portion of the second encapsulant 33 disposed between the protruding portions 122p may be removed such that a portion of a surface 12s2 of the protruding portion 122p is exposed. Further, a portion of the second portion 122 of the circuit layer 12 is removed such that the lateral surface 12s1 is coplanar with the lateral surface 12s2. Further, a portion of the core substrate 40 disposed between the protruding portions 122p may be removed such that the core substrate 40 has a surface 40s4 recessed from the first surface 40s1 of the core substrate 40.

Figure 29:
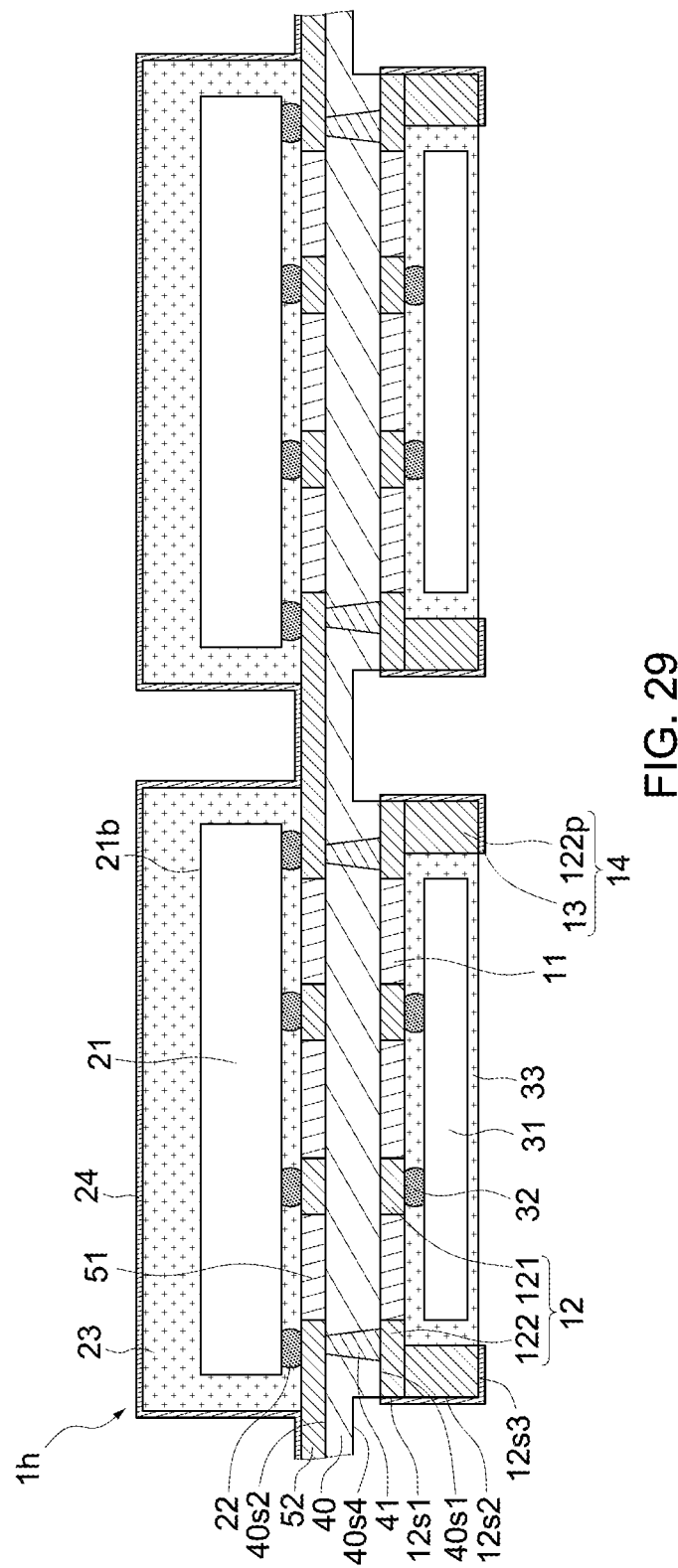
FIG. 29 illustrates one or more stages of an example of a method for manufacturing a semiconductor package structure according to some embodiments of the present disclosure.

Referring to FIG. 29, a first protection layer 13 and a second protection layer 24 are formed. The first protection layer 13 may be formed on the protruding portion 122p. The second protection layer 24 may be formed on the first encapsulant 23 and cover a portion of the second circuit layer 52. As shown in FIG. 29, the outer lateral surface 12s1 and the outer lateral surface 12s2 of the first circuit layer 12 are covered by the first protection layer 13.

Figure 30:
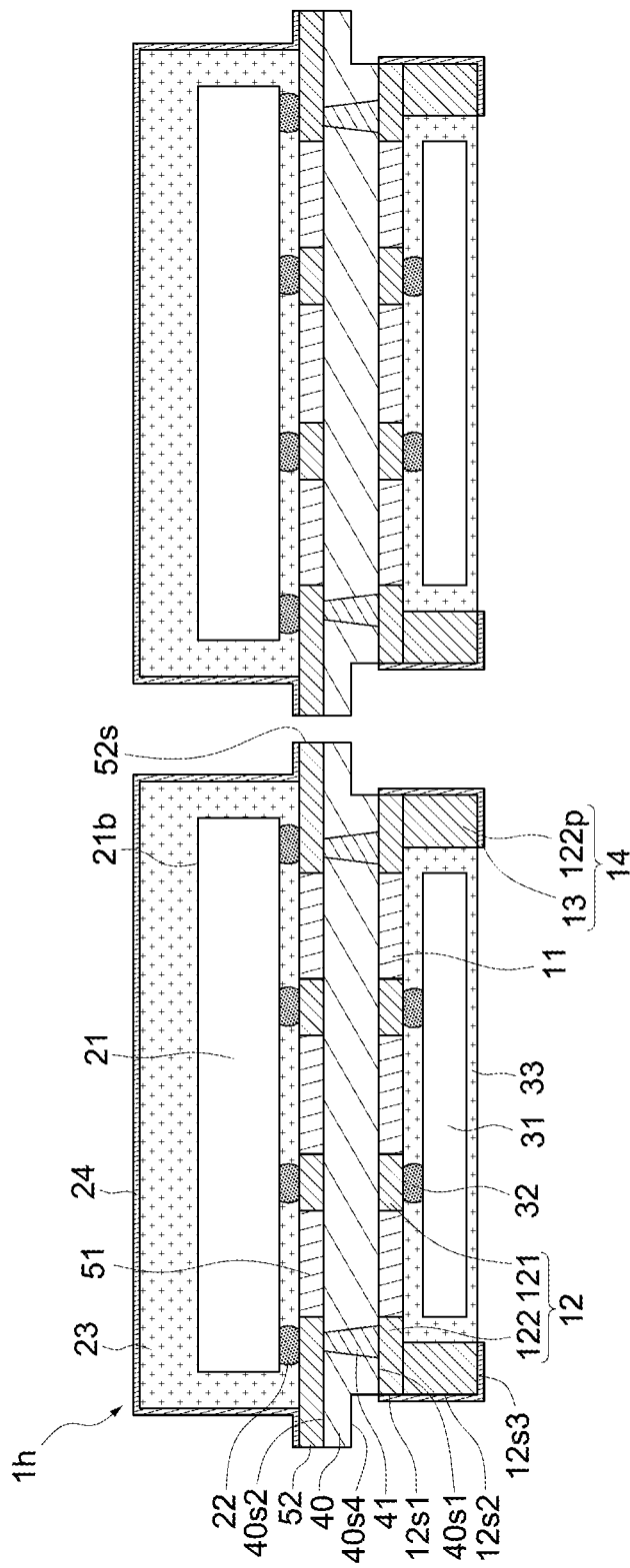
FIG. 30 illustrates one or more stages of an example of a method for manufacturing a semiconductor package structure according to some embodiments of the present disclosure.

Referring to FIG. 30, a singulation process may be performed to form a plurality of semiconductor package structures 1h. The singulation process may include sawing the core substrate 40, the second protection layer 24 and the second circuit layer 52. After the singulation process, a lateral surface 24s1 of the second protection layer 24 is substantially coplanar with the lateral surface 52s of the second circuit layer 52 and the lateral surface 40s3 of the core substrate 40.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±substrate structure 10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±substrate structure 10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±substrate structure 10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately substrate structure $10^4$ S/m, such as at least substrate structure $10^5$ S/m or at least substrate structure $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a substrate structure, comprising:
        a first passivation layer having a first surface and a second surface opposite to the first surface;
        a first circuit layer having a first portion disposed adjacent to the second surface of the first passivation layer and having an outer lateral surface; and
        a first protection layer disposed on a second portion of the first circuit layer and exposed from the first surface of the first passivation layer;
    a first semiconductor die disposed on the second surface of the first passivation layer;
    a first encapsulant covering the first semiconductor die and the second surface of the first passivation layer, wherein there is a predetermined distance between the outer lateral surface of the first circuit layer and a lateral surface of the first encapsulant; and
    a second semiconductor die disposed on the first surface of the first passivation layer;
    a second encapsulant encapsulating the second semiconductor die, wherein the second encapsulant is surrounded by the second portion of the first circuit layer, wherein the second encapsulant has a surface substantially coplanar with the first protection layer.

2. The semiconductor package structure of claim 1, wherein the substrate structure further comprises:
    a core substrate disposed between the first passivation layer and the first semiconductor die;
    a second passivation layer spaced apart from the first passivation layer by the core substrate; and
        a second circuit layer spaced apart from and electrically connected to the first circuit layer; and
        a second protection layer disposed on the second circuit layer wherein the second protection layer covers the first encapsulant.

3. A method of manufacturing a substrate structure, comprising:
    (a) forming a first circuit layer, wherein the first circuit layer comprises a first portion and a second portion;
    (b) forming a first passivation layer covering the first portion of the first circuit layer, wherein the second portion of the first circuit layer is exposed from the first passivation layer;
    (c) forming a first protection layer on the second portion of the first circuit layer; and
    (d) sawing the first passivation layer such that an outer lateral surface of the first circuit layer is covered by the first passivation layer or the first protection layer;
    wherein before (a), the method further comprises:
        (a1) providing a carrier, wherein a conductive foil is disposed on the carrier,
    wherein in (a), the first circuit layer is formed on the conductive foil and exposes a portion of the conductive foil, wherein in (b), the first passivation layer covers the portion of the conductive foil; and wherein after (d), the method further comprises:
        (e) removing the carrier; and
        (e1) removing the conductive foil from the first circuit layer and the first passivation layer.

4. The semiconductor package structure of claim 1, wherein the lateral surface of the first encapsulant is substantially coplanar with the outer lateral surface of the first passivation layer.

5. The semiconductor package structure of claim 4, wherein the lateral surface of the first encapsulant is substantially coplanar with the first protection layer.

6. The semiconductor package structure of claim 1, further comprising:
    a solder disposed on the first protection layer, wherein the solder is configured to correspond to a bonding pad of a carrier, wherein after the solder is bonded to the bonding pad, the solder exceeds an outer lateral surface of the first encapsulant.

7. The semiconductor package structure of claim 6, wherein after the solder is bonded to the bonding pad, the solder is tapered along a direction from the first surface toward the second surface of the first passivation layer.

8. The method of claim 3, wherein in (d) further comprises:
    sawing the first protection layer.

* * * * *